United States Patent
Chidambarrao et al.

(10) Patent No.: US 6,417,572 B1
(45) Date of Patent: Jul. 9, 2002

(54) PROCESS FOR PRODUCING METAL INTERCONNECTIONS AND PRODUCT PRODUCED THEREBY

(75) Inventors: Dureseti Chidambarrao, Weston, CT (US); Ronald G. Filippi, Wappingers Falls, NY (US); Robert Rosenberg, Cortlandt Manor, NY (US); Thomas M. Shaw, Peekskill, NY (US); Timothy D. Sullivan, Underhill, VT (US); Richard A. Wachnik, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/354,592

(22) Filed: Jul. 16, 1999

Related U.S. Application Data

(63) Continuation-in-part of application No. 08/910,381, filed on Aug. 13, 1997, now abandoned.

(51) Int. Cl.⁷ .......................... H01L 23/48; H01L 23/52; H01L 29/40

(52) U.S. Cl. .......................... 257/773; 257/775; 257/765

(58) Field of Search .................... 257/773, 775, 257/734, 774, 764, 765

(56) References Cited

U.S. PATENT DOCUMENTS

| | | | |
|---|---|---|---|
| 4,166,279 A | 8/1979 | Gangulee et al. | |
| 4,438,450 A | 3/1984 | Sheng et al. | |
| 4,654,692 A | 3/1987 | Sakurai et al. | |
| 4,923,526 A | 5/1990 | Harada et al. | |
| 5,018,001 A | 5/1991 | Kondo et al. | |
| 5,071,714 A | 12/1991 | Rodbell et al. | |
| 5,101,261 A | 3/1992 | Maeda | |
| 5,289,036 A | 2/1994 | Nishimoto | |
| 5,329,162 A | 7/1994 | Nadaoka | |
| 5,382,831 A | 1/1995 | Atakov et al. | |
| 5,391,921 A | 2/1995 | Kudch et al. | |
| 5,461,260 A | 10/1995 | Varker et al. | |
| 5,470,788 A | 11/1995 | Biery et al. | |
| 5,472,911 A | 12/1995 | Dreyer et al. | |
| 5,504,037 A | 4/1996 | Iwamatsu | |
| 5,548,159 A | 8/1996 | Jong | |
| 5,561,083 A | 10/1996 | Bollinger et al. | |
| 5,689,139 A | 11/1997 | Bui et al. | |
| 5,712,510 A | 1/1998 | Bui et al. | |
| 5,859,476 A * | 1/1999 | Onoda | 257/775 |
| 6,081,036 A * | 6/2000 | Hirano et al. | 257/773 |
| 6,169,326 B1 * | 1/2001 | Jun | 257/734 |

OTHER PUBLICATIONS

R.H. Koch, J.R. Lloyd, J. Cronin, Phys. Rev. Lett. 55, 2487 (1985).

G.J. Chern, W.G. Oldham, N. Cheung, IEEE Trans. Electron Devices ED–33, 1256 (1986).

(List continued on next page.)

Primary Examiner—Phat X. Cao
(74) Attorney, Agent, or Firm—Ratner, Prestia; Tiffany L. Townsend, Esq.

(57) ABSTRACT

A process for producing a multi-level semiconductor device having metal interconnections with insulating passivation layers and the product produced thereby. The product and process improve the resistance of the metallization interconnections to extrusion-short electromigration failures by preventing the insulating passivation layers from cracking. The product and process also reduce the level of resistance saturation or the maximum resistance shift caused by electromigration. By replacing wide-line metallization interconnection conducting lines surrounded by insulating passivation layers with two or more narrow, parallel conducting lines having aspect ratios less than or equal to unity with passivation layers located in between, the incidence of passivation cracking and extrusion-short failures is reduced. The process is especially suited for use in multi-level wiring structures in which the wiring levels have diffusion barriers between the wiring levels caused by redundant metallization layers, interlevel connections, or both.

21 Claims, 14 Drawing Sheets

OTHER PUBLICATIONS

C-K Hu, P.S. Ho, M.B. Small, K. Kelleher, Mat. Res. Soc. Symp. Proc. 225, 99 (1991).

C-K Hu, M.B. Small, P.S. Ho, J. Appl. Phys. 74, 969 (1993).

R.G. Filippi, H.S. Rathore, R.A. Wachnik, D. Kruger, in VMIC 1992, Proceedings of the International VLSI Multilevel Interconnection Conference, Jun., p. 359.

I.A. Blech, J. Appl. Phys. 47, 1203 (1976).

R.G. Filippi, G.A. Biery, R.A. Wachnik, J. Appl. Phys. 78, 3756 (1995).

R.G. Filippi, R.A. Wachnik, H. Aochi, J.R. Lloyd, M.A. Korhonen, Appl. Phys. Lett. 69, 2350 (1996).

Paul C. Paris and George Sih p. 30 ASTM Pub 31 "Fracture Toughness Testing and its Applications" ASTM, Philadelphia, PA (1964).

M.A. Korhonen, P. Borgeson, K.N. Tu, C.Y. Li, J. Appl. Phys. 73 (8) 3790 (1993).

H.S. Rathor, J.J. Estabil, F. Dorleans, 29th International Reliability Physics Society p. 57, IEEE/IRPS, Apr. 1991.

Z. Suo, "Stable State of Interconnect Under Temperature Change and Electric Current," Mechanical and Environmental Engineering Department, and Materials Department;University of California, Santa Barbara (Not Dated).

* cited by examiner

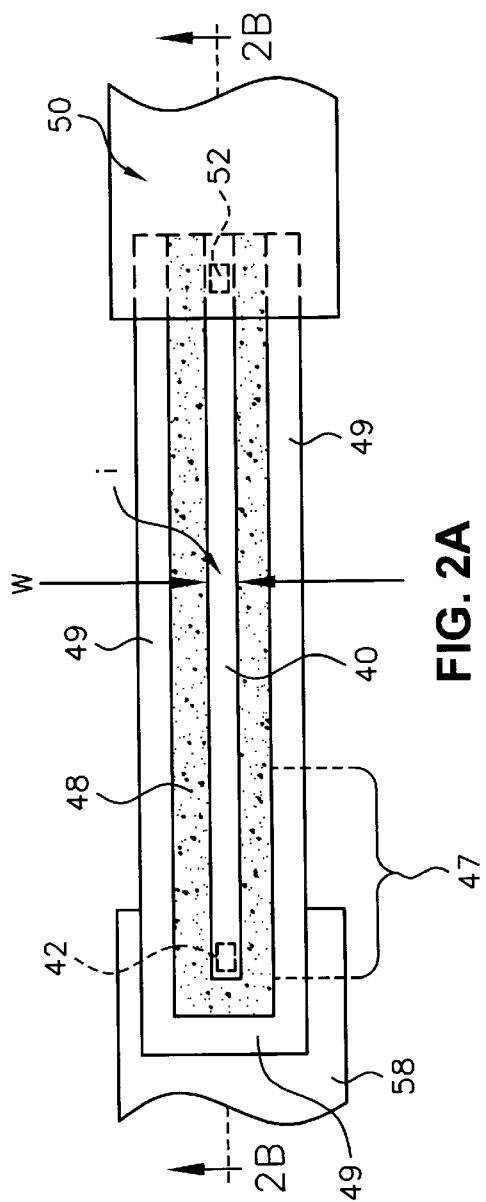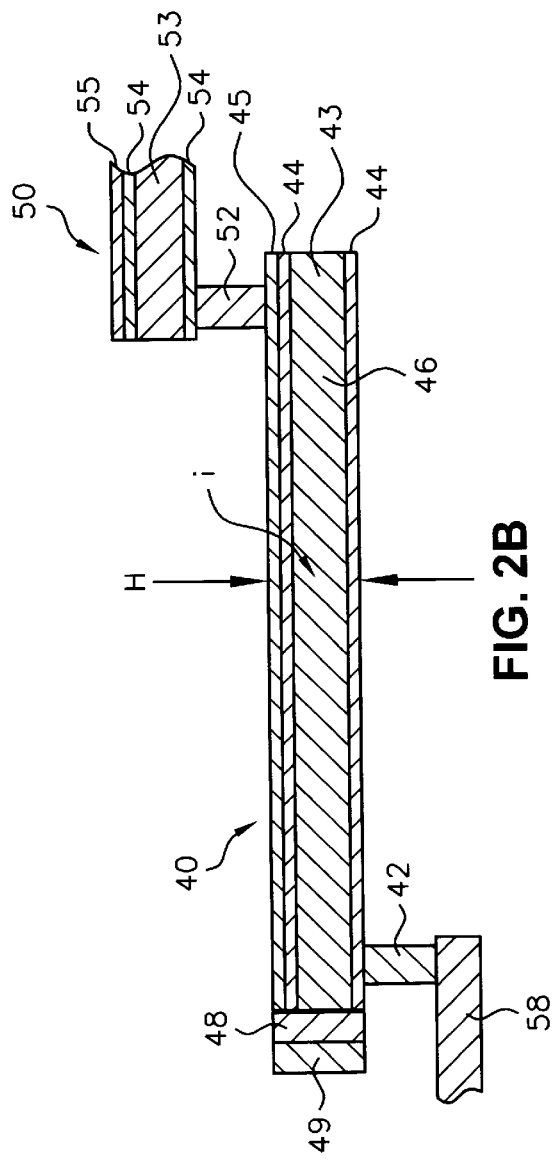
FIG. 2A
FIG. 2B

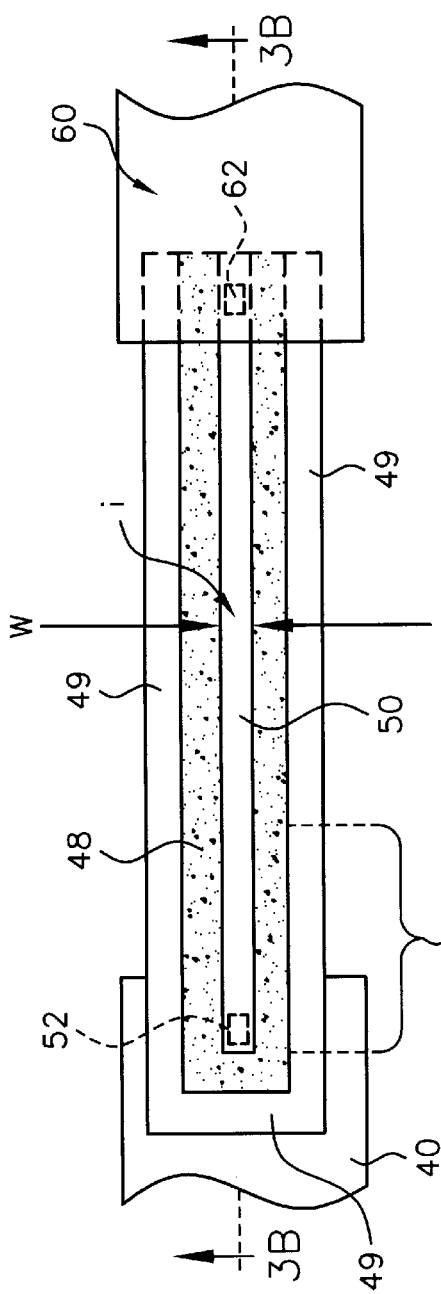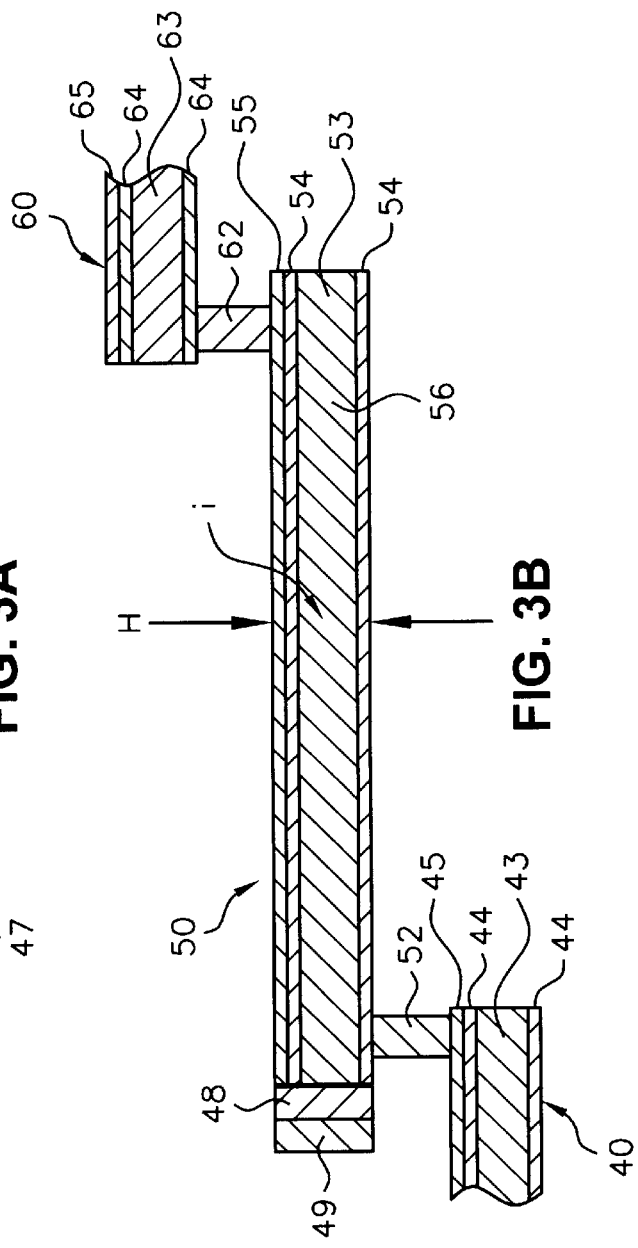

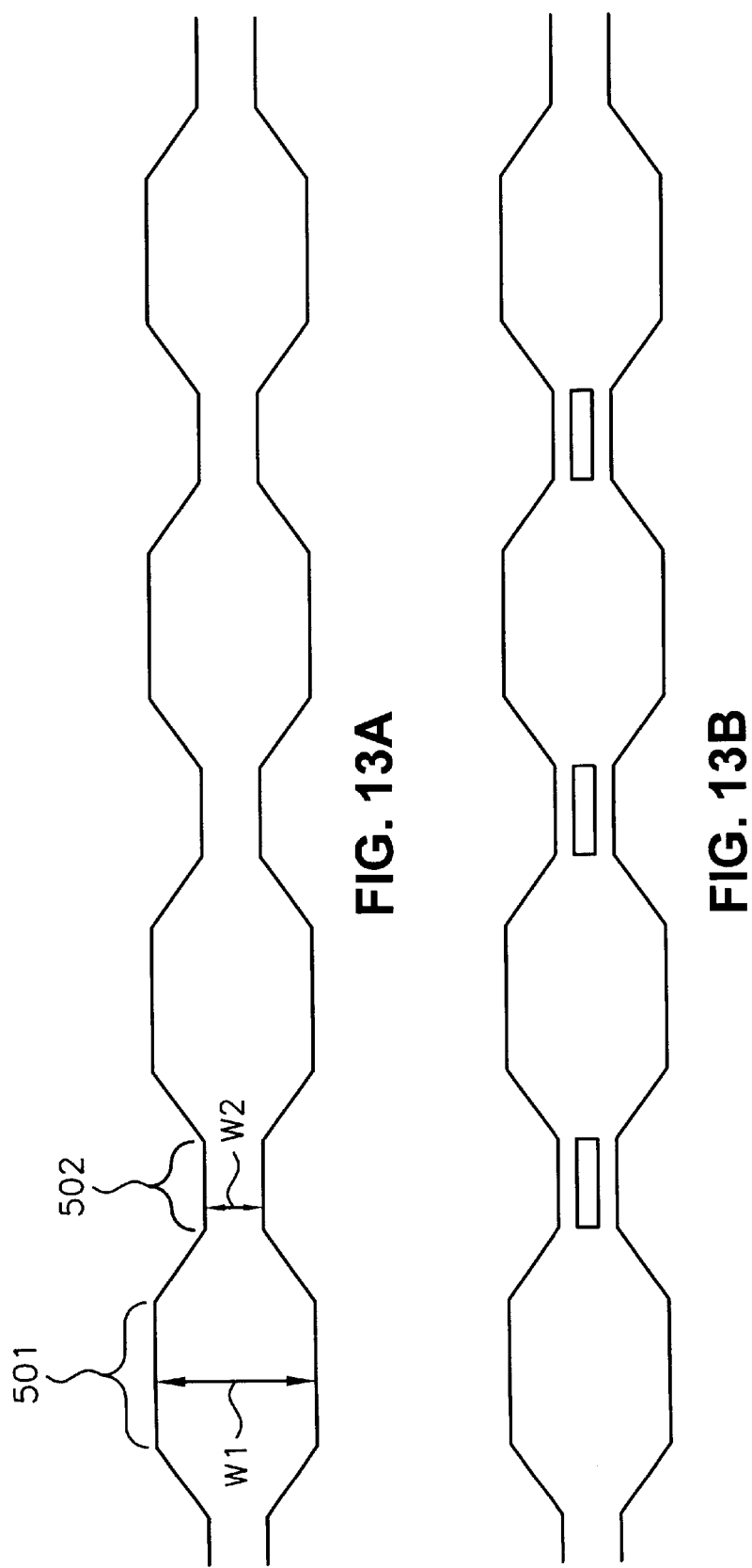

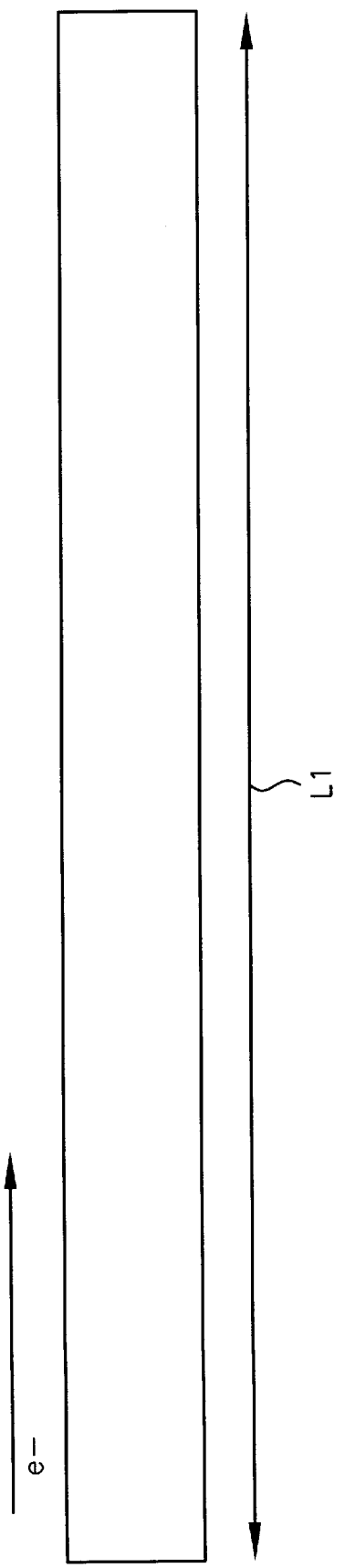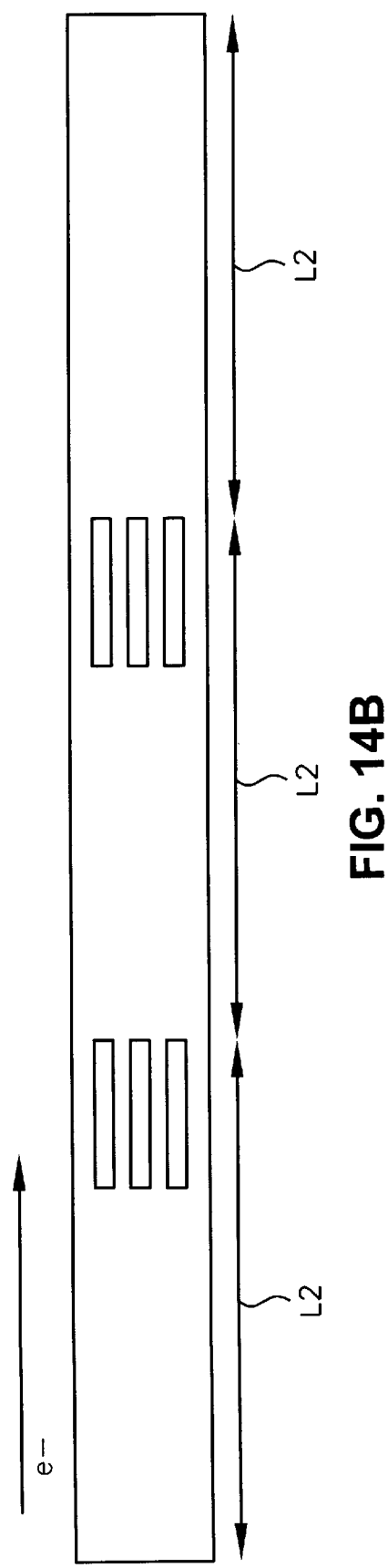

PROCESS FOR PRODUCING METAL INTERCONNECTIONS AND PRODUCT PRODUCED THEREBY

CROSS REFERENCE TO RELATED APPLICATIONS

This is a continuation-in-part of Application Ser. No. 08/910,381, filed Aug. 13, 1997, abandoned.

FIELD OF THE INVENTION

The present invention is generally related to semiconductor devices and, more particularly, to the design of metal contacts and interconnections for semiconductor integrated circuits which reduce passivation cracking and extrusion-short failure caused by electromigration. The invention also relates to providing various processes for obtaining the designed structure.

BACKGROUND OF THE INVENTION

Integrated Circuits (IC) typically incorporate and rely on aluminum (Al) based interconnections to carry current to and from active devices (i.e., MOSFETS and Bipolar Transistors). Interconnections of copper (Cu) and gold (Au) have also been used and continue to be used for a limited number of applications. The reliability of these interconnections is generally limited by a phenomenon known as electromigration. Electromigration is the motion of metal atoms in a conductor due to the passage of current. It is basically a diffusion phenomenon in which metal ions and vacancies diffuse in opposite directions with the applied electric field appearing to act as the driving force.

Aluminum-based thin-film metallizations, which are widely used to form conductor patterns and silicate integrated circuits, are especially susceptible to failure caused by electromigration. Electromigration can lead to failure in these devices primarily by one of two failure mechanisms. In both mechanisms, diffusion of the interconnect metal occurs along grain boundaries to cause a net amount of aluminum to migrate in the direction of the electron flow. In the first failure mechanism, aluminum diffuses away from a region in the interconnect faster than the availability of additional atoms can take its place. This forms vacancies. The diffusion of aluminum typically occurs from certain regions, often points where three grains touch, to create vacancies which coalesce at points of flux divergence. As a result, voids are left behind at the negative end of the interconnection. With continued aluminum mass transport, the void grows until a failure occurs, in the interconnection, known as a void-open failure. Although a resistance increase is usually observed in multi-layered metallizations before catastrophic failure occurs, single-layered metallizations may show little or no resistance increase before failing catastrophically.

The second mechanism, by which electromigration failure occurs, is caused by the electromigration of metal atoms into a region faster than the atoms escape the region which creates a local pile-up of metal atoms downstream of the electron flow to form hillocks at the positive end of the interconnection. In confined metal interconnects, such as those deposited on an oxidized silicon substrate and covered by a dielectric passivation layer, the accumulation of metal atoms due to continued mass transport exerts pressure on surrounding insulator layers which are contiguous to the interconnect. As the pressure increases due to continued mass transport, cracks form in the insulator into which aluminum can extrude. Short circuit failures, known as extrusion-short failures, occur when the extruded material extends and contacts adjacent interconnection lines to cause electrical short circuits. As microelectronics circuits are made more dense in order to improve performance, the electric fields (and resulting current densities) in the aluminum interconnects increase. Hence, as circuit densities increase, the rate of electromigration also increases.

The points of flux divergence at which void-open electromigration failures are known to occur (and from which, in single-layer metallization structures, corresponding extrusion-short failures result) vary according to the microstructure and morphology of the wiring structure. In thin-film conductors, flux divergences may be caused by non-uniform structures (e.g., discontinuities such as grain boundaries, variation in grain size, and variation in grain orientation) and non-uniform operating temperatures. Prior art efforts at reducing the probability of electromigration failures for a given time, temperature, and current typically include fabricating conducting interconnects which attempt to reduce flux divergence by eliminating structural non-uniformities.

For wiring structures having single-layer metallization interconnections, flux divergences in the metallization conductors commonly occur at discontinuities of grain structures. U.S. Pat. No. 4,438,450 issued to Sheng et al., U.S. Pat. No. 5,101,261 issued to Maeda, and U.S. Pat. No. 5,382,831 issued to Atakov et al., all attempt to reduce the diffusion flux in single-layer metallization interconnection structures by creating a plurality of narrow interconnect conductors for an integrated circuit in place of a single, wider conductor. The plurality of narrow interconnect conductors are provided in widths comparable to the grain size of the metal interconnect to produce a morphology commonly referred to as a "bamboo microstructure." In this manner, the metal grains which extend from top to bottom of the conductor and from one side to the other side of the conductor act as blocking grains to prevent the formation of a continuous path of grain boundaries along the length of the patterned conductor.

As a result, the mass transport of the interconnect metal atoms is retarded which in turn slows the formation of voids and minimizes the associated resistance increase. In turn, because the mass transport of interconnect metal atoms is retarded, the incidence of extrusion-short failures is also reduced by blocking grains in single-layer metallization interconnects because the source of atoms which flow downstream of the current flow is reduced. Thus, by replacing a wide-line interconnect (i.e., an interconnect having widths greater than 1 to 1.5 times the mean grain size) with narrow-line interconnects (i.e., interconnects having widths less than 1 to 1.5 times the mean grain size), the atomic flux due to electromigration along the line is reduced. From this replacement it follows that the integrated circuits containing single-layer metallization interconnects are less likely to fail from electromigration, both from void-open and extrusion-short failures, during operation.

Progress toward device scaling of integrated circuits, however, requires increasing the numbers of wiring levels, defined with greater precision, density, and yield. As noted by Hu et al, "Electromigration in Al(Cu) two-level structures: Effect of Cu and kinetics of damage formation," J. Appl. Phys. 74 (2), pp. 969–978 (1993), the problem of electromigration increases for multi-level interconnect structures because narrower line widths lead to higher current densities. In devices having multi-level wiring levels, however, additional flux divergences may also occur at interfaces between the conductor lines caused by structural non-uniformities such as diffusion barriers between the metallization interconnect layers. Diffusion barriers are particularly are a problem in multi-level structures such as Very Large Scale Integration (VLSI) or Ultra Large Scale Integration (ULSI) devices in which the metallization layers are typically connected by tungsten interlevel connection studs. Because the interlevel connection studs hinder diffusion between various wiring levels, replenishment of depleted metal atoms is prevented, eliminating what is known as the "reservoir effect." As a result, voids form upstream of the electron flow in the vicinity of the stud which can lead to a void-open failure thereby decreasing the electromigration lifetime of metal interconnections.

In multilevel wiring structures, the current density near the interfaces between conductor lines may increase due to current crowding. U.S. Pat. No. 5,461,260 issued to Varker et al., attempts to reduce the peak localized interconnect current density by creating a plurality of narrow interconnect conductors near the interlevel contact. It should be understood, however, that Varker et al., disclose a structure where current flows through this structure out of the interconnect and then into the interlevel contact. By well established electronic engineering convention electron flow is in the direction opposite to current flow and thus the disclosed structure applies to the cathode or electron current source end of the structure.

For metallization interconnections in multi-level wiring structures having multi-layer metallization interconnections, the resistance increase due to electromigration void formation saturates (i.e., reaches a maximum value) when the stress gradient induced by electromigration balances the electromigration driving force. As reported by Filippi et al, Appl. Phys. Lett. 69, pp. 2350–52 (1996), for a two-level structure having 0.30 um wide metallization interconnections of aluminum-copper (Al—Cu) sandwiched between redundant layers of titanium (Ti) and titanium nitride (TiN) and tungsten interlevel connection studs at both ends, the maximum absolute resistance change follows a $jL^2$ dependence where j is the current density and L is the distance between the interlevel connection studs. The saturation of the resistance increase indicates the suppression of electromigration-induced damage caused by void formation. A corresponding accumulation of aluminum atoms, however, occurs downstream at the anode end of the conductor which, as reported by I. A. Blech, *Electromigration in Thin Aluminum Films on Titanium Nitride*, J. Appl. Phys. 47, pp. 1203–08 (1976), results in a stress gradient which opposes the electromigration driving force. In the presence of diffusion barriers, this accumulation of aluminum atoms creates a region in the metal which causes an increased compressive stress to be exerted upon any contiguous insulation layers which are typically present. This accumulation of aluminum atoms and the stress caused thereby can lead to cracking of the insulation, and can cause extrusion of the metal in the cracks thus formed, resulting in extrusion-short failures with other interconnection levels.

A method to suppress electromigration-induced damage in multi-level structures was disclosed by Bui et al., in U.S. Pat. No. 5,712,510. Bui et al., disclose the use of openings filled with insulator to create divergences or discontinuities in the metal flux during electromigration and spaced apart along the conducting layer at a sufficiently small distance. This distance corresponds to the minimum backflow potential capacity, which is related to the stress gradient that opposes the electromigration driving force. It should be understood, however, that the invention of Bui et al. is most effective when implemented in the middle of the interconnection. Bui et al. neither claim nor disclose openings greater than or of the same dimension as the width of the conductive layer. In addition, their invention does not apply to metal interconnections with lengths shorter than the length corresponding to the minimum backflow potential capacity for the metal interconnections.

Methods of reducing the effect of void formation on the electrical resistance of interconnect conductors in multi-level metallization structures have been provided by incorporating multiple continuous redundant conductive layers in each interconnection wiring level. U.S. Pat. No. 4,166,279 issued to Gangulee et al. and U.S. Pat. No. 5,071,714 issued to Rodbell et al. illustrate this approach in which redundant under layers, over layers, or both are incorporated on the sides of the interconnect which do not eliminate the formation of void-open failures; rather, they provide an alternative connective electrical path should a void-open occur in the metal interconnect. The redundant layers typically comprise different elements or compounds, one or more of which has a very high melting temperature or very low diffusion coefficient, compared to the major layer which is chosen for its low electrical conductivity. Typically the grain size of the redundant under layer or over layer of a multi-layer conductor is much less than the width of the conducting interconnect. In these redundant layer structures, the grains of the interconnect metal typically do not extend from the top of the conductor to the bottom of the conductor or from one side to the other side of the conductor. When a void forms because atoms migrate along the length of the line, the redundant layer provides an electrically continuous path so that the increase in resistance caused by any voids which form in the conducting interconnect is negligible and the function of the integrated circuit is not reduced.

Because electron flow is shunted around any voids which may form, extrusion-short failures in such multi-layer metallization structures are not prevented. The observed mean time to failure by resistance increase for such structures depends on current density and not on width. This indicates that the most important diffusion path for atoms of aluminum and copper is not along the boundaries between aluminum grains but is instead at the interface between the titanium aluminide and the aluminum containing copper. Thus, even if any blocking grains or bamboo structures are provided in an interconnect with redundant layers, they are short circuited by diffusion along the interface such that extrusion-short failures may still occur. Although multi-level metallization interconnections having redundant metal layers alleviate void-open electromigration failures in multi-level wiring structures, therefore, the accumulation of interconnect metal atoms in these structures still creates extrusion-short failures and passivation layer cracking which ultimately lead to electromigration failure.

Thus, except for circuits sensitive to small resistance changes, the problem of passivation cracking and extrusion-short failures is the predominant mode of electromigration failure which occurs in multi-level structures having multiple interconnection wiring levels. This failure mode of extrusion failures is especially exacerbated in the case where individual wiring levels have multi-layer structures. In these multi-level wiring structures, passivation cracking and extrusion-short failures are especially exacerbated by the presence of diffusion barriers created by tungsten interlevel connections between interconnection levels having multiple metallization layers such as titanium aluminide, aluminum containing copper, and titanium aluminide.

SUMMARY OF THE INVENTION

The present invention provides a process for producing a multi-level semiconductor device having metal interconnections with insulating passivation layers and the product produced thereby. First, the invention improves the resistance of the metallization interconnections to extrusion-short electromigration failures and prevents the insulating passivation layers from cracking. Second, the invention reduces the effect of void formation. Specifically, the invention provides a process for producing semiconductor devices having multi-level wiring structures with alternating metallization interconnections and insulating passivation layers. By replacing conventional wide-line metallization interconnection conducting lines surrounded by insulating passivation layers with two or more narrow, parallel conducting lines having aspect ratios less than or equal to unity with passivation layers located in between, 1) the incidence of passivation cracking and extrusion-short failures is reduced, and 2) the size of the void and the resistance increase at long times is reduced. The process of the present invention is especially suited for use in multi-level wiring structures in which the wiring levels have diffusion barriers between the wiring levels caused by redundant metallization layers, interlevel connections, or both.

BRIEF DESCRIPTION OF THE DRAWING

The invention is best understood from the following detailed description when read in connection with the accompanying drawing, in which:

FIG. 2A is a planar view of a two-level interconnection stud-chain test structure;

FIG. 2B is a cross-sectional side view of the two-level interconnection stud-chain test structure shown in FIG. 2A;

FIG. 3A is a planar view of a three-level interconnection stud-chain test structure;

FIG. 3B is a cross-sectional side view of the three-level interconnection stud-chain test structure shown in FIG. 3A;

FIG. 13A is a planar view of a wide conducting interconnect according to the present invention which consists of region 501 of width w1 and region 502 of width w2, where w1>w2 and the interconnect alternates between regions 501 and 502, and regions 501 and 502 are electrically connected;

FIG. 13B is a planar view of a wide conducting interconnect according to the present invention similar to that shown in FIG. 13A but with passivation-filed holes disposed along region 502;

FIG. 14A is a planar view of a wide conducting interconnect of length L1;

FIG. 14B is a planar view of a wide conducting interconnect according to the present invention which includes regions of passivation-filled holes and regions of no such holes, where the total length of the interconnect is L1 and the length between regions of passivation-filled holes is L2.

DETAILED DESCRIPTION OF THE INVENTION

Figure 1B:
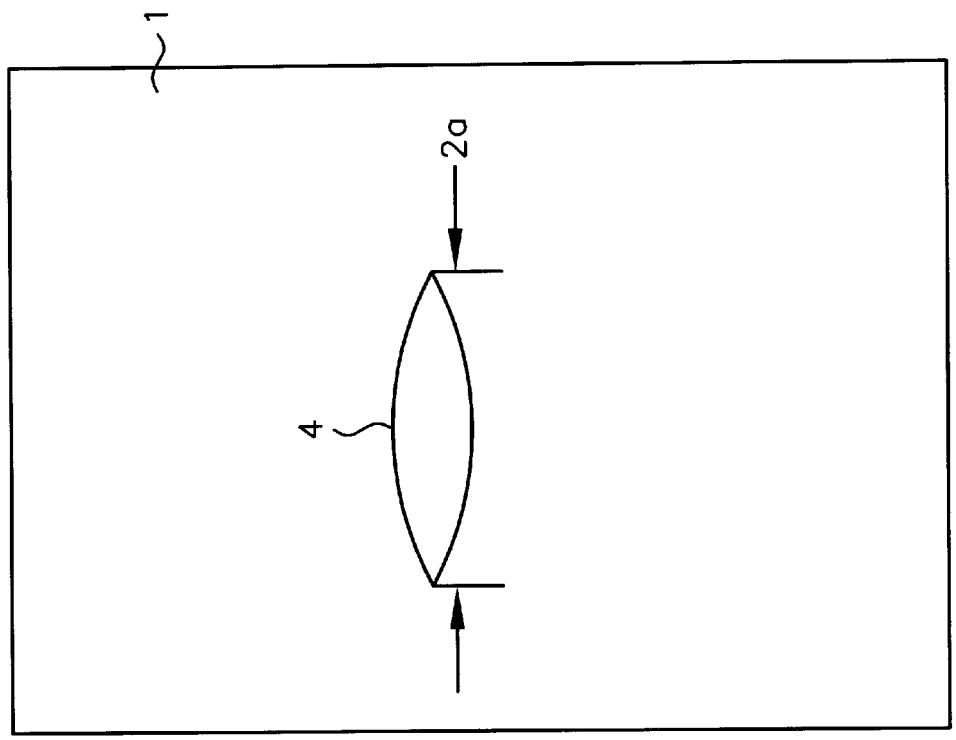
FIG. 1B is a cross-sectional view of an insulating body containing a crack having width $2a$.

Unless defined otherwise, all technical and scientific terms used herein have the same meaning as commonly understood by those of ordinary skill in the art to which this invention belongs. Although any methods and materials similar to or equivalent to those described herein can be used in the practice of the present invention, the methods and materials described herein are preferred. The materials, methods, and examples are only exemplary and not limiting.

The present invention provides a process for producing integrated circuit devices having multi-level metallization interconnect layers with insulating passivation layers and the product produced thereby. More particularly, the present invention improves the resistance of the metallization interconnect layers to extrusion-short electromigration failures and prevents the insulating passivation layers from cracking. It is emphasized that, pursuant to common practice, the various dimensions of the integrated circuit devices and the component layers incorporated therein according to the present invention as shown in the drawing are not necessarily to scale. To the contrary, the various dimensions shown may be arbitrarily expanded or reduced for clarity.

Specifically, the invention provides a process for producing metallization interconnections for integrated circuit devices having multi-level wiring levels. Although not intending to be limited by the theoretical discussion provided below, the present inventors in developing the process of the present invention have utilized the concepts of Linear Elastic Fracture Mechanics (LEFM) to predict the critical stress, $\sigma_c$, required for propagating crack growth into a passivation layer disposed around metal interconnections. When subjecting multi-level metallization devices to high current densities, accumulation by electromigration of metal atoms which comprise the interconnect layers exerts stresses upon the surrounding passivation layers such that cracking occurs if the stress exceeds $\sigma_c$. The use of a wide-line interconnect layer surrounded on all sides by a contiguous passivation layer acts in similar fashion to a crack in an infinite insulating medium made of a dielectric such as a passivation layer. According to the process of the present invention, by subdividing a wide-line interconnect into two or more parallel lines, each having a width less than or equal to the thickness of the line, the incidence of passivation cracking and extrusion-short failures may be reduced, if not eliminated, in multi-level structures.

Figure 1A:
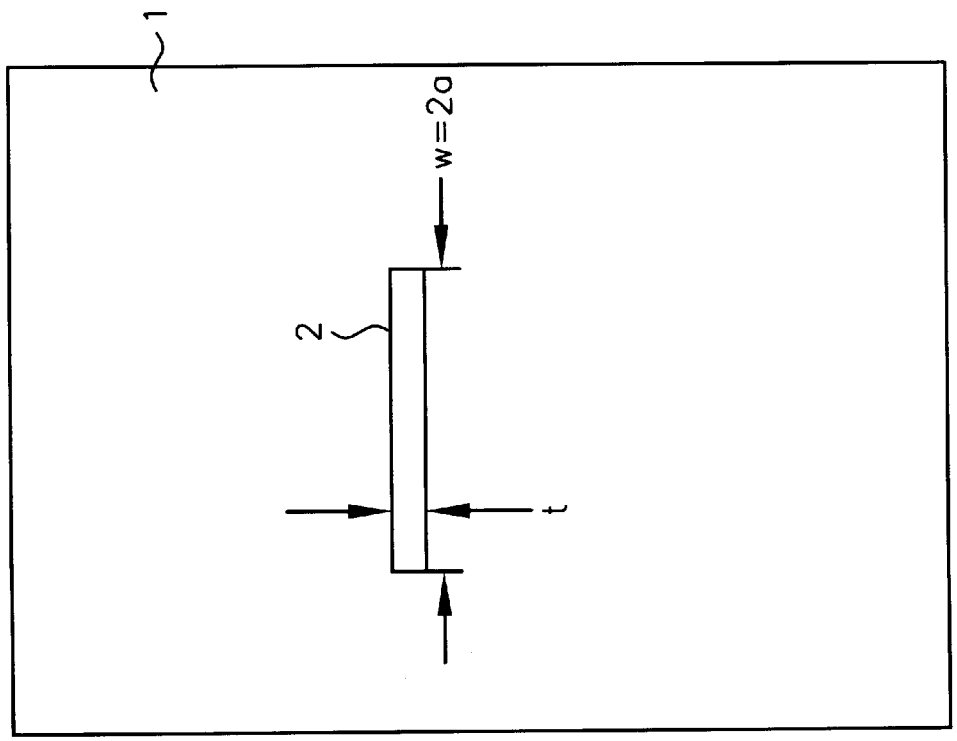
FIG. 1A is a cross-sectional view of an insulating body containing a conductor having width $2a$.

Referring now to the drawing, wherein like reference numerals refer to like elements throughout, FIG. 1A shows an insulating body 1 which contains a wide-line interconnect conductor 2 having width, w, equal to 2a. As the ratio of the width, w, to the thickness, t, of interconnect conductor 2 increases, the wide-line behaves like a crack 4 having a length 2a located in insulating body 1 as shown in FIG. 1B. The initiation of a nascent crack at the edge of wide-line interconnect conductor 2 is required to generate the high stresses sufficient to break chemical bonds between the atoms of insulating body 1. A nascent crack at the edge of wide-line interconnect conductor 2 is generally present, and although not intending to be limited by theory, believed to be caused by residual stresses, residues, interfaces, or surface modifications which occur during semiconductor processing. Based on this model, the stress required to extend a small crack nascent at the edge of wide-line interconnect conductor 2 is similar to that required to extend a crack with length equal to the width of wide-line interconnect conductor 2 plus the length of the nascent crack.

According to LEFM, the critical stress a, which must be applied to the inside of a crack surface to extend the crack of length 2a is given by Eqn. 1 as:

Eqn. 1:
$$\sigma_c = \frac{\sqrt{\pi} K_{Ic}}{\sqrt{a}} (\frac{\pi}{2} + 1)1$$

wherein the constant $K_{Ic}$, is a function of the material of insulating body 1. When the applied stress exceeds the critical stress, crack propagation beyond its length of 2a is energetically favorable because the energy required to create new internal surfaces by breaking inter-atomic bonds is offset by the reduction in elastic energy stored in the infinite medium of insulating body 1.

The stress on the inside of a nascent crack surface in dielectric passivation layers surrounding a metal conductor is provided by the forces generated by the downstream accumulation of metal atoms caused by electromigration of the interconnect conductor 2. As reported by M. A. Korhonen et al., J. Appl. Phys. 73 (8) 3790 (1993), the applied stress generated by electromigration at the end of a finite line is approximated by Eqn. 2 as:

Eqn. 2:
$$\sigma = \frac{j\rho q^*}{\Omega} \left( -\frac{L}{2} + 4L \sum_{n=0 \to \infty} \frac{\exp(-m_n^2 \tau)}{m_n^2} \right)$$

where $\tau = \left(\frac{B\Omega D_a}{kT}\right)\frac{t}{L^2}$, and $m_n = (2n+1)\pi$ and the resistivity $\rho$, the effective charge q*, the atomic volume $\Omega$, the modulus B, and the atomic Diffusivity, $D_a$ are properties of the material of the interconnect conductor 2 which electromigrates; t is the length of time during which current flows; Boltzmann's constant is denoted by k and the temperature (in Kelvin) by T; and j represents the density of electrical current which flows in a metal conducting line of length L and width W and having blocking boundaries. This stress increase occurs at the downstream (with respect to electron flow) end of a conductor and is affected by time and the design variables of current density and line length. Equation 2 may be written as a linear function of time by appropriate approximations as will be readily recognized by those having ordinary skill in the art.

If a sufficiently large current is applied for a sufficiently long time to a conductor of sufficient length, the stress at the blocking boundary in the conductor may exceed the critical stress $\sigma_c$ given above. Above this stress, crack propagation in the insulator becomes energetically favorable in order to relieve the stored elastic energy. Once a crack has formed, metal will typically enter into the crack and, if the crack extends far enough to contact a nearby conductor, an electrical extrusion-short results which leads to failure of the circuit.

Combining the above expressions of a diffusion kinetic model (Eqn. 2) and a sharp crack fracture mechanics model (Eqn. 1) gives the following equation, $$T_{50}^{extr} \sigma_c = C(w^{-0.5})2 \qquad \text{Eqn. 3}$$

where $T_{50}^{extr}$ 3 is the median extrusion limited lifetime, w is the width of the line, $\sigma_c$ is the critical stress above which a crack can propagate, and C is a constant related to the current, temperature, interconnect line length, and to the properties of the metal and the passivation material. Thus, the time to failure is inversely proportional to the square root of the width of the interconnect conductor line.

The improved reliability of the metallization interconnections for multilevel wiring structures according to the present invention is obtained by patterning the horizontal dimension of the conducting interconnect in one of several related patterns all of which divide wide-line interconnect conductors into several parallel conducting lines with passivation dispersed in between the lines.

To investigate the effect of varying the width-to-thickness aspect ratio of metallization interconnections upon electromigration extrusion-short failures in multi-level structures, two-level and three-level stud-chains were used to simulate the interconnection levels which are closest to active devices in Very Large Scale Integration (VLSI) or Ultra Large Scale Integration (ULSI) structures. In order to maximize the diffusion barriers between the wiring levels, in addition to tungsten interlevel connection studs between the levels, redundant metallization layers were also provided on the individual interconnection wiring levels as described in detail below.

TWO-LEVEL WIRING STRUCTURE DESIGNED TO FAIL IN FIRST LEVEL METALLIZATION

Shown in FIGS. 2A and 2B are planar and cross-sectional views, respectively, of a stud-chain test structure to simulate a two-level wiring having interconnects 40 and 50 which are metallization layer conductors connected by interlevel connection stud 52 made of tungsten. Both interconnects 40 and 50 are multi-layered stack metallizations of $TiAl_3/Al$—Cu/ $TiAl_3/TiN$. Interconnect 40 comprises a 4500 Å thick aluminum-copper (Al—Cu) layer 43 having a copper concentration of 0.5 wt % sandwiched between redundant 600

Å thick titanium aluminide (TiAl$_3$) layers 44 and a 320 Å thick titanium nitride (TiN) layer 45. Interconnect 50 comprises a 5600 Å thick aluminum-copper (Al—Cu) layer 53 having a copper concentration of 0.5 wt % sandwiched between redundant 1000 Å thick TiAl$_3$ layers 54 and a 320 Å thick TiN layer 55. Interconnects 40 and 50, respectively, represent M1 and M2 conducting multi-layer interconnect lines or conducting contacts. Also provided is an additional interlevel connection stud 42 made of tungsten which is connected to a local interconnect 58 also made of tungsten for simulating connections to active or passive devices in an IC substrate. The interlevel connection studs 42 and 52 both have widths of 0.35 μm and 0.45 μm, respectively, heights of 0.6 μm and 0.9 μm, respectively, and centers located approximately 0.1 μm–0.41 μm from the ends of the interconnects.

Upon applying a current, a flow of electrons results in the direction of the current arrow labeled "i" with a mass transport of aluminum atoms taking place in the same direction. As discussed above, because interlevel connection studs 42 and 52 act as diffusion barriers, they prevent replenishment of the aluminum atoms from interconnect 50 to interconnect 40. The redundant metallization layers of interconnects 40 and 50 also act as diffusion barriers between the wiring levels. As a result of the diffusion barriers provided, the test structure is designed to produce a void formation region 46 upstream of the electron flow "i" in the aluminum-copper (Al—Cu) layer 43 of interconnect 40. A corresponding compressive stress region 47 occurs downstream of the electron flow "i" which ultimately leads to cracking of an insulating passivation layer 48 of silicon dioxide which is disposed contiguously with interconnect 40. A continuous conducting line of aluminum-copper is provided as an extrusion monitor element 49. Extrusion monitor element 49 operates by detecting extrusion-short failures which occur between interconnect 40 and extrusion monitor element 49 as a result of further electromigration of the aluminum atoms of aluminum-copper layer 43 into cracks which occur in insulating passivation layer 48. Although shown having a uniform cross-section of aluminum-copper in FIGS. 2B and 3B, it is to be understood that extrusion monitor element 49 need only be fabricated using a conductive material in order to detect extrusion-short failures. For facilitating the manufacture of the test samples, however, extrusion monitor element 49 was fabricated simultaneously during the manufacture of interconnects 40 and 50 shown in FIGS. 2B and 3B, respectively, to produce the same multilayer cross-sections of the conductive interconnects.

Figure 4:
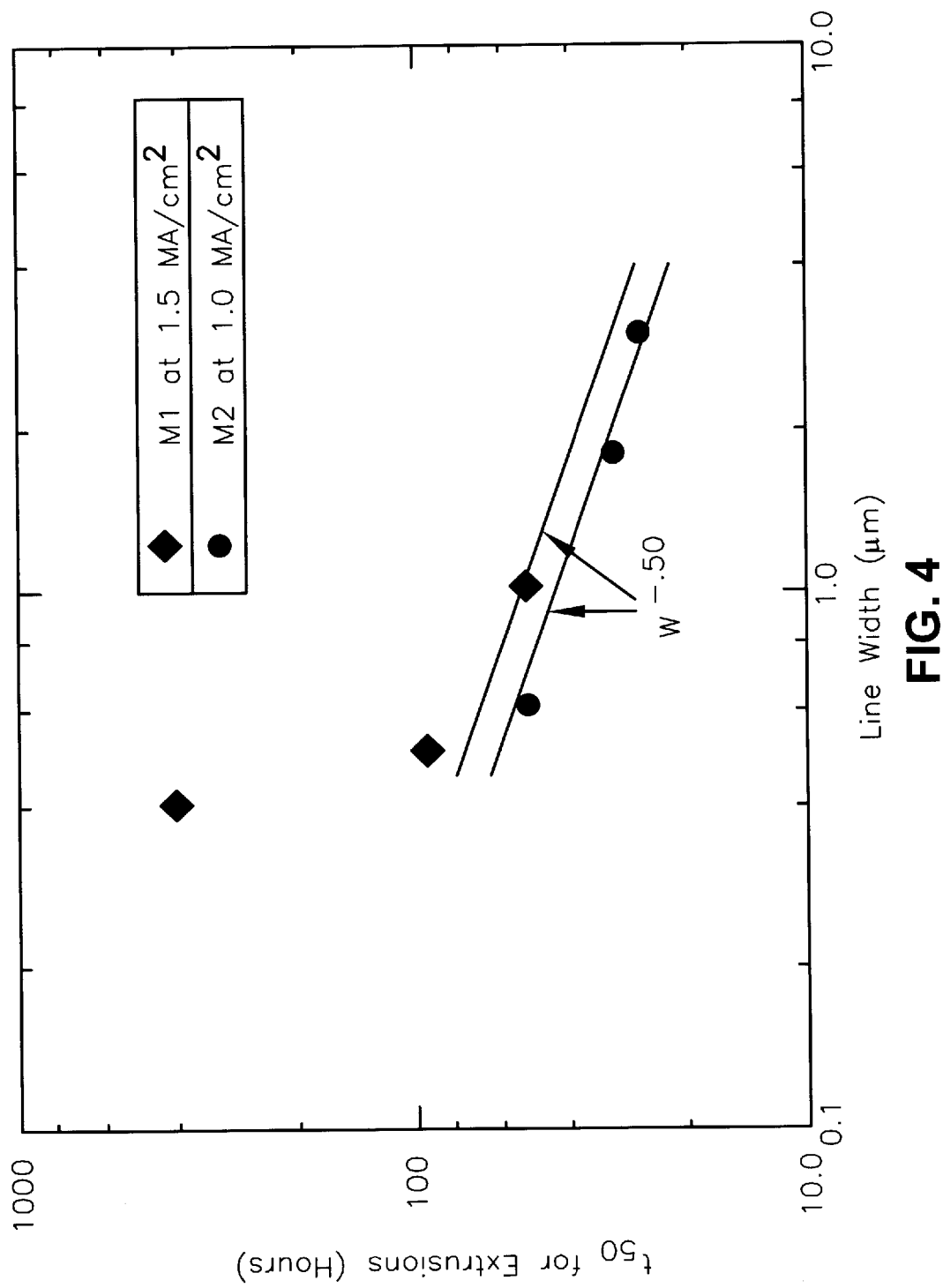
FIG. 4 is a graph showing the time to extrusion-short failure for different widths of M1 and M2 conducting interconnections.
Figure 5:
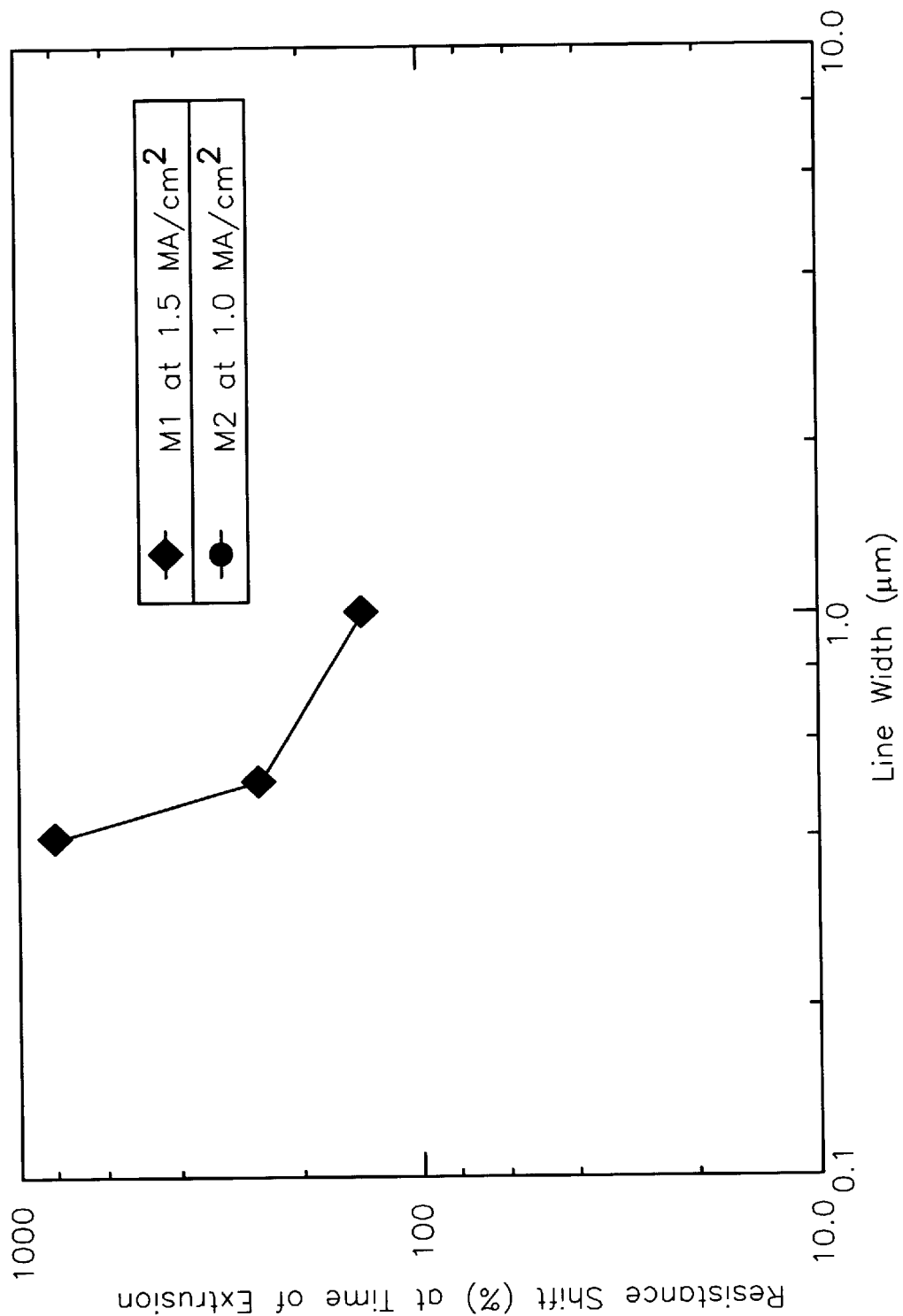
FIG. 5 is a graph showing the resistance of a conducting interconnect at the time of extrusion as a function of interconnection line width for M1 and M2 conducting interconnections.

In order to evaluate the effect of varying the aspect ratio of an M1 metallization interconnect (the aspect ratio being defined as W/H where W is the transverse width of interconnect 40 shown in FIG. 2A and H is the transverse height of interconnect 40 shown in FIG. 2B) on electromigration extrusion-short failures in the M1 metallization interconnect, the width, W, was varied while the height, H, of interconnect 40 and all other dimensions of the components of the test structure were kept constant. Three structures having the dimensions in Table 1 below were tested at 250° C. by applying a current density of 1.5 mA/cm$^2$ between interconnect 50 as a current source and local interconnect 58 as a current drain. For each of the structures, sixteen samples were constructed and tested each having metallization interconnects of 200 μm lengths. The time to failure by extrusion-short failure (t$_{50}$) and the increase in the resistance (Resistance Shift (%)) at time of extrusion-short failure were measured. The resultant data, which are median values for each of the sixteen samples tested per test structure, are shown below in Table 1 and, respectively, graphed in FIGS. 4–5 plotted using diamonds (♦).

TABLE 1

| Height (H) (μm) | Width (W) (μm) | Aspect Ratio (W/H) | t$_{50}$ (Hours) | Resistance Shift (%) |
|---|---|---|---|---|
| 0.60 | 0.40 | 0.67 | 408 | 835 |
| 0.60 | 0.50 | 0.83 | 96 | 253 |
| 0.60 | 1.00 | 1.67 | 53 | 141 |

THREE-LEVEL WIRING STRUCTURE DESIGNED TO FAIL ON SECOND LEVEL METALLIZATION

Shown in FIGS. 3A and 3B are planar and cross-sectional views, respectively, of a stud-chain test structure to simulate a three-level wiring having interconnects 40, 50, and 60, connected by interlevel connection studs 52 and 42 which are made of tungsten. The structure shown in FIGS. 3A and 3B is identical to that shown in FIGS. 2A and 2B, respectively, except for the addition of a third-level metallization interconnect 60 connected by interlevel connection stud 62 shown in FIGS. 3A and 3B and the elimination of local interconnect 58 and interlevel connection stud 42 shown in FIGS. 2A and 2B. Interconnect 60, like interconnects 40 and 50, is a multi-layered stack metallization of TiAl$_3$/Al—Cu/TiAl$_3$/TiN which comprises a 5600 Å thick aluminum-copper (Al—Cu) layer 63 (with copper concentration of 0.5 wt %) sandwiched between redundant 1000 Å thick titanium aluminide (TiAl$_3$) layers 64 and a titanium nitride (TiN) layer 65 which is 320 Å thick. Using this structure, the electromigration resistance behavior of an M2 interconnect in a three-level wiring structure was simulated in which interconnect 40 represented an M1 wiring level, interconnect 50 represented an M2 wiring level, and interconnect 60 represented an M3 wiring level.

To evaluate the effect of varying the aspect of an M2 metallization interconnect (the aspect ratio being defined as W/H where W is the transverse width of interconnect 50 shown in FIG. 3A and H is the transverse height of interconnect 50 shown in FIG. 3B) on electromigration extrusion-short failures in the M2 metallization interconnect, the width, W, was varied while the height, H, of interconnect 50 and all other dimensions of the components of the test structure remained constant. Three structures having the dimensions in Table 2 below were tested at 250° C. by applying a current density of 1.0 mA/cm$^2$ between interconnect 60 as a current source and interconnect 40 as a current drain. For each of the structures, sixteen samples were constructed and tested each having metallization interconnects of 200 μm lengths. The time to failure by extrusion-short failure (t$_{50}$) and the increase in the resistance (Resistance Shift (%)) at time of extrusion-short failure were measured. The resultant data, which are median values for each of the sixteen samples tested per test structure, are shown below in Table 2 below and, respectively, graphed in FIGS. 4–5 plotted using circles (●).

TABLE 2

| Height (H) (μm) | Width (W) (μm) | Aspect Ratio (W/H) | $t_{50}$ (Hours) | Resistance Shift (%) |
|---|---|---|---|---|
| 0.84 | 0.60 | 0.71 | 52 | 158 |
| 0.84 | 1.8 | 2.14 | 31 | 101 |
| 0.84 | 3.0 | 3.57 | 27 | 88 |

DISCUSSION OF DATA

Shown in FIGS. 4–5 are graphs of the data of Tables 1 and 2 which illustrate that by subdividing wide-line interconnect lines (i.e., those having widths which are greater than the thickness) into two or more parallel lines, each having a width less than or equal to the thickness of the interconnect line, the electromigration resistance to extrusion-short failure is enhanced.

FIG. 4 shows the time to failure for extrusion for different widths of conducting interconnects subjected to the same density of current during operation for each group of electromigration test structures (i.e., M1 or M2) described above. It can be seen from FIG. 4 that narrow interconnect lines (i.e., those having smaller aspect ratios) extrude later than wider interconnect lines. Specifically, for both an M1 structure (represented by the diamond data points) and an M2 structure (represented by the circle data points) it can be seen that when the aspect ratios of the interconnect lines are above unity, the data points generally lie along the lines labeled "$w^{-0.5}$" and therefore exhibit the dependence expected from equation 3. Thus, the data supports the LEFM model which predicts that the observed time to extrusion-short failure is a function of line width.

For interconnections having aspect ratios less than or equal to unity, a marked increase in the time to extrusion failure is observed with preferred aspect ratios being below about 0.67. Specifically, for an M1 structure (represented by the diamond data points) the preferred aspect ratio is about 0.67 or below (i.e., when the line width approaches about 0.4 μm). Thus, for an M1 interconnection having an aspect ratio about 0.67 or below, the time to extrusion-short failure is significantly longer such that electromigration failure by extrusions does not occur. For an M2 structure (represented by the circle data points), although the minimum aspect ratio tested was about 0.71 (i.e., when the line width approaches about 0.6 μm), no samples with aspect ratios were available for testing having the preferred aspect ratio of about 0.67 or below. A significant increase in lifetime is expected, however, for M2 lines with aspect ratios of 0.67 or below as this is consistent with the M2 data which were obtained.

FIG. 5 shows that the increase in resistance of a conducting interconnect at the time of extrusion-short failure is less for a wider line for both first level metal interconnections (M1) and second level metal interconnections (M2). The fractional increase in resistance in a given length of a metallic interconnect is directly related to and is a measure of the fraction of material displaced in the line. This indicates that for wider lines the extrusion failure mode occurs when less material is displaced or when less stress is generated in compressive stress region 47 by the displaced material. Thus, the extrusion failure mode is more significant in wider lines than narrow lines.

In short interconnections, the stress gradient causes the resistance increase with time to saturate, or reach a maximum value. The resistance change at saturation, $\Delta R_{sat}$, is known to depend on current density and line length, as reported by Filippi et al., Appl. Phys. Lett. 69, pp. 2350–52 (1996). It can be shown that the fractional resistance change in saturation $(\Delta R/R)_{sat}$ times the line length, L, is equal to $$L(\Delta R/R)_{sat} = Kj\rho eZ^*L^2/2\Omega B - KL_0 4: \qquad \text{Eqn. 4}$$

where K is a proportionality constant that relates void length to resistance change, j is the current density, ρ is the aluminum resistivity, eZ* is the effective ion charge, Ω is the atomic volume, B is the effective elastic modulus and $L_0$ is the length of a void over (under) the blocking boundary.

Figure 6:
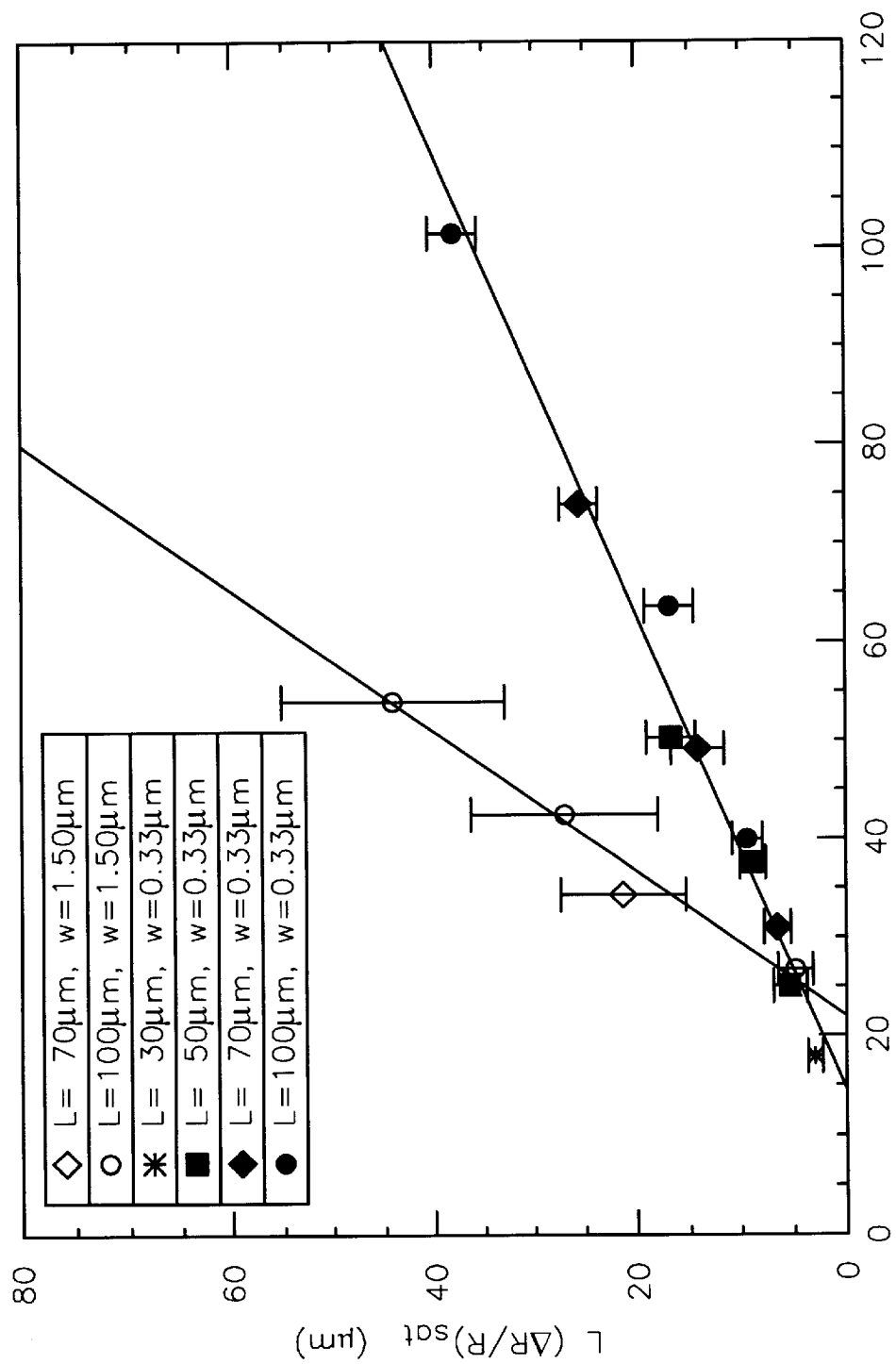
FIG. 6 is a plot relating the resistance change at saturation to the product of current density and the square of the line length for different interconnection line lengths, L, and interconnection line widths, w.

FIG. 6 shows a plot of $L(\Delta R/R)$sat versus $jL^2$ for line widths of 0.33 and 1.50 um. The stud-chain structure tested for this study is nearly identical to the one shown in FIGS. 2A and 2B. The only differences are that the AlCu thickness is 4040 A instead of 4500 A, and the TiAl$_3$ layers above and below the AlCu layer are 520 A thick. The data in FIG. 6 indicate that wide lines saturate at higher resistance levels than narrow lines. This is due to the fact that the B term in the above equation represents an effective modulus that is smaller for wider lines than for narrow lines. In other words, a passivated narrow conductor represents a more rigid structure than a passivated wide conductor. Therefore, more atoms can be forced into the anode end of a wide conductor, which causes the resistance change at saturation to be higher.

It is useful and occasionally critical to reduce the resistance increase during operation of a metal conductor. A solution that reduces the level of resistance saturation in wide conductors is to replace a wide conducting line with several parallel conducting lines with passivation between. While this increases the current density in the metal there is an increase in the effective modulus which offsets the increase in current density. Ideally a wide line should be divided into numerous narrow lines by passivation-filled regions. The total width of the structure can remain the same and this would impose little cost on the circuit designer.

The problem of controlling passivation cracking and metal extrusion, or resistance saturation in metal interconnects has not been solved before. Extrusion failures usually occur for long lines since a sufficiently high stress is required to crack the surrounding passivation. Applying the present invention to short lines will not effect the incidence of extrusions. Resistance saturation only occurs for short lines since the stress in long lines will become so high as to cause extrusion failure. Applying the present invention to long lines will not effect the saturation level.

PROCESSES FOR PRODUCING METALLIZATION INTERCONNECTIONS

A variety of processes may be used to produce integrated circuits having multilevel metallization interconnection schemes according to the present invention. The only requirement for such processes is that they must be capable of forming interconnects having aspect ratios less than or equal to unity with preferred aspect ratios being below about 0.67. The conducting interconnects are typically fabricated on a semiconductor substrate for connecting the terminals of active and passive devices contained in the substrate. The details of the fabrication methods discussed below determine the location of constraints and blocking boundaries. In determining the dimensions of the metal conductors used in integrated circuits several considerations, such as resistance capacitance and ease of fabrication, dictate the optimal thickness, width, and length of the conductors to be formed. Preferably, in order to facilitate manufacturing operations, conventional metallization interconnects having line widths greater than three times the thickness of the line are subdivided into two or more parallel lines with each line having an aspect ratio in accordance with the present invention as set forth above.

Described below are three exemplary processes which may be implemented to produce the metallization interconnections of the present invention. It is understood that these methods are only exemplary and are not limiting with respect to the techniques which may be used to practice the present invention.

PROCESS 1: Damascene Inter Level Contact with Subtractive Etch of Conductor

A. MULTI-LEVEL INTERCONNECTION SCHEME

Figure 7:
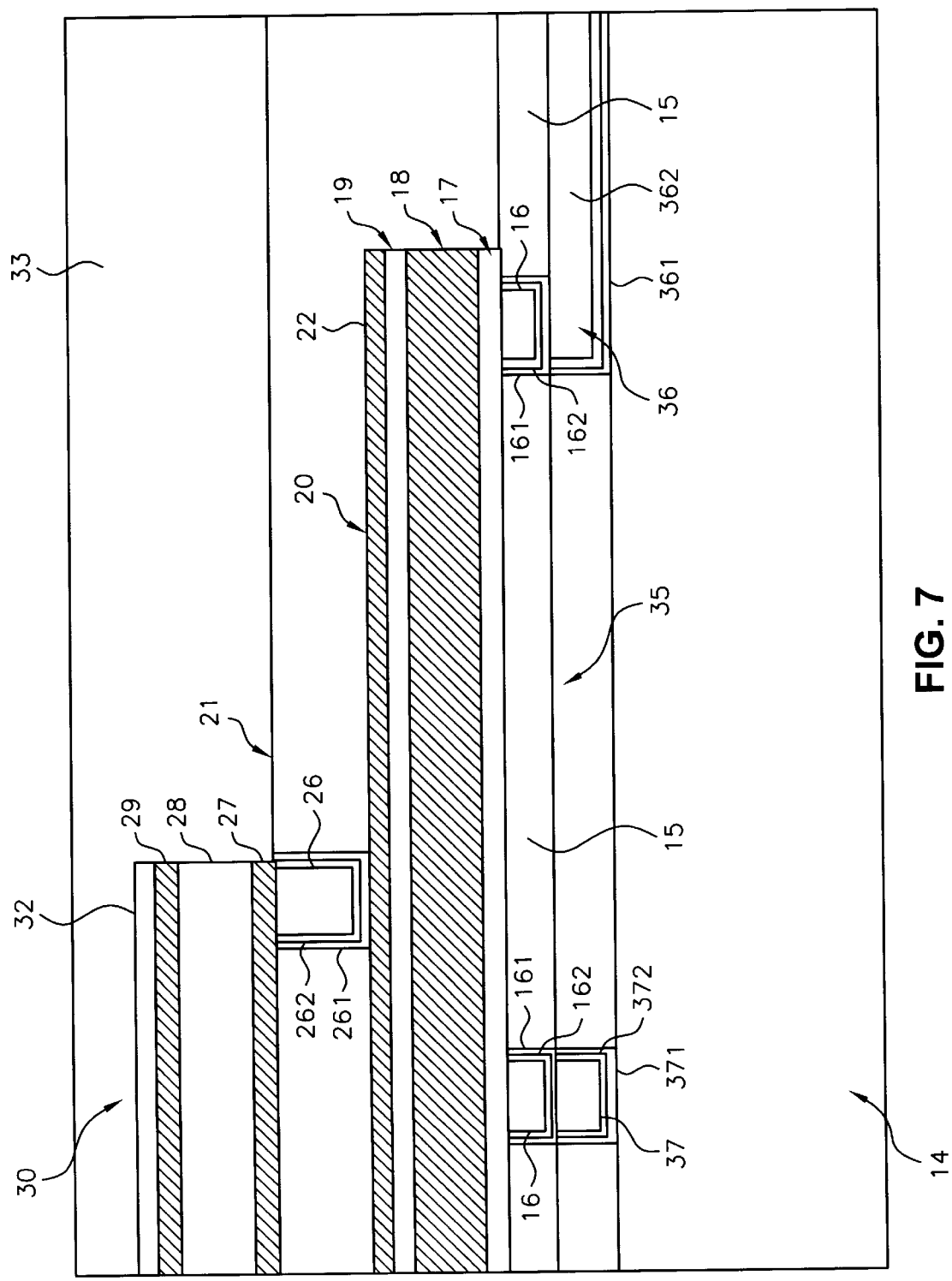
FIG. 7 is a planar view of a conducting interconnect fabricated using a subtractive etch.

The test structures shown in 2A, 2B, 3A, and 3B, were fabricated using both damascene and subtractive etch processes as set forth in detail below to represent integrated circuit devices having multi-level interconnection schemes such as that shown in FIG. 7. Shown in FIG. 7 is a multi-level interconnection scheme formed by alternating stacked multiple metallization layers between $SiO_2$ insulating passivation layers 21, 33 and stacked $SiO_2$ insulating passivation layers 15 and 35. The stacked metallization layers were subtractively etched to form M1 and M2 conducting interconnects 20 and 30, respectively.

Briefly, the damascene/subtractive etch process entails forming a damascene tungsten layer which fills a trench and a hole located in $SiO_2$ insulating passivation layer 35 to respectively form local conducting interconnect 36 and an interlevel connection stud 37 upon a substrate 14. A second $SiO_2$ insulating passivation layer 15 is disposed on both insulating passivation layer 35 and local conducting interconnect 36. Tungsten interlevel connection studs 16 are then formed in holes located in insulating passivation layer 15 using a damascene process. Multiple metallization layers are then laid down and a subtractive etch step is then performed to leave an M1 conducting interconnect 20 only in regions where it is desired. A planarized $SiO_2$ insulating passivation layer 21 is disposed on M1 conducting interconnect 20. The process is then repeated to form a second, M2 conducting interconnect 30 disposed upon insulating passivation layer 21 which is connected to M1 conducting interconnect 20 via a damascene tungsten interlevel connection stud 26. Both the multiple metallization layers of M1 conducting interconnect 20 and M2 conducting interconnect 30 comprise an aluminum-containing layer containing 0.5 wt %-Cu. A third $SiO_2$ insulating passivation layer 33 is disposed on both insulating passivation layer 21 and M2 conducting interconnect 30.

The subtractive etch/damascene process steps which may be used to make the test structures shown in FIGS. 2A, 2B, 3A, and 3B, and the integrated circuit device shown in FIG. 7 are known in the art of semiconductor manufacturing. An exemplary process which may be used is described in detail below with respect to the manufacture of the device shown in FIG. 7 and comprises the steps of:

a. depositing on a substrate 14 a $SiO_2$ insulating passivation layer 35 and planarizing using chemical mechanical polishing or an etch back technique which techniques are known in the art;

b. applying a resist layer and patterning level using lithographic techniques to locate holes where interlevel connection stud 37 and local conducting interconnect 36 are to be formed for establishing contact to the underlying substrate 14;

c. etching holes using the patterned resist layer as a mask;

d. depositing a barrier metallurgy such as 600 Å thick layer of titanium 361, 371 followed by a 400 Å thick layer of titanium nitride 362, 372;

e. depositing a 4000 Å–8000 Å layer of tungsten using chemical vapor deposition (CVD) to form interlevel connection stud 37 and local conducting interconnect 36;

f. removing excess tungsten metal and planarizing by chemical mechanical polishing using an etch or polish compound which selectively removes tungsten metal faster than the $SiO_2$ insulator material of $SiO_2$ insulating passivation layer 35;

g. depositing 6000 Å of $SiO_2$ insulator material to form an $SiO_2$ insulating passivation layer 15;

h. applying a resist and patterning using lithographic techniques to locate holes where interlevel connection studs 16 are to be formed in order to contact underlying tungsten local conducting interconnect 36 and interlevel connection stud 37;

i. etching holes using the patterned resist layer as a mask;

j. depositing a barrier metallurgy such as a 600 Å thick layer of titanium 161 followed by a 400 Å thick layer of titanium nitride 162;

k. depositing a 4000 Å–8000 Å layer of tungsten using chemical vapor deposition (CVD) to form interlevel connection studs 16;

l. removing excess tungsten metal and planarizing by chemical mechanical polishing using an etch or polish compound which selectively removes tungsten metal faster than the $SiO_2$ insulator material of $SiO_2$ insulating passivation layer 15;

m. depositing a layer of titanium by sputtering 150 Å titanium. Upon annealing in step r below, the titanium layer reacts with part of the aluminum-containing layer which is deposited in step n to form a $TiAl_3$ layer 17 of the multi-layer M1 conducting interconnect 20;

n. depositing an aluminum-containing layer by sputtering a 5400 Å thick layer of aluminum containing 0.5 wt % Cu. This aluminum-containing layer forms a middle aluminum-containing layer 18 of multi-layer M1 conducting interconnect 20;

o. sputtering a 150 Å layer of titanium followed by a 320 Å layer of titanium nitride. Upon annealing in step r below, the titanium layer reacts with part of the aluminum-containing layer deposited in step n to form a $TiAl_3$ layer 19 of the multi-layer M1 conducting interconnect 20. The titanium nitride layer forms titanium nitride layer 22 of M1 conducting interconnect 20;

p. applying a resist layer and, using lithographic techniques known in the art, patterning to locate an M1 conducting interconnect 20;

q. etching the multi-layer metal film using a chlorine-containing etch to form M1 conducting interconnect 20 having an aspect ratio in accordance with the present invention as set forth above;

r. annealing at 400° C. in 10% $H_2$/90% $N_2$ for a time sufficient to form the intermetallic compound $TiAl_3$ layers 17 and 19 and to dissolve any interfacial layers;

s. depositing a 18000 Å thick $SiO_2$ insulating passivation layer 21 and planarizing this layer using chemical mechanical polishing techniques which are known in the art;

t. applying a resist and patterning using lithographic techniques to locate holes where interlevel connection stud 26 is to be formed in order to contact underlying M1 conducting interconnect 20;

u. etching holes using the patterned resist layer as a mask;
v. depositing a barrier metallurgy such as a 600 Å thick layer of titanium 261 followed by a 400 Å thick layer of titanium nitride 262;
w. depositing a 4000 Å–8000 Å layer of tungsten using chemical vapor deposition (CVD) to form interlevel connection stud 26;
x. removing excess tungsten metal and planarizing by chemical mechanical polishing using an etch or polish compound which selectively removes tungsten metal faster than the $SiO_2$ insulator material of $SiO_2$ insulating passivation layer 21;
y. depositing a bottom layer of the multi-layer M2 conducting interconnect 30 by sputtering a 250 Å titanium. This bottom layer of titanium will form a $TiAl_3$. intermetallic layer 27 by reacting with part of an aluminum-containing layer which is deposited in step z during the annealing performed in step ad below;
z. depositing an aluminum-containing layer by sputtering a 7600 Å thick layer of aluminum containing 0.5 wt % Cu. This layer forms a middle, aluminum-containing layer 28 of multi-layer M2 conducting interconnect 30;
aa. sputtering a 130 Å thick layer of titanium followed by 250 Å thick layer of titanium nitride 32. The 250 Å titanium layer will form a $TiAl_3$ intermetallic layer 29 by reacting with part of the aluminum-containing layer deposited in previous step z during the annealing performed in step ad below;
ab. applying a resist, pattern as taught in this invention using lithographic techniques known in the art;
ac. etching the multi-layer metal film using a chlorine containing etch;
ad. annealing at 400° C. in 10% $H_2$/90% $N_2$ to form the intermetallic compound $TiAl_3$ layers 27 and 29 and to dissolve any interfacial layers; and
ae. depositing a 18000 Å thick $SiO_2$ insulating passivation layer 33 and planarizing this layer using chemical mechanical polishing techniques known in the art.

Steps s through ae may be repeated to form additional layers of conducting interconnects.

B. ADDITIONAL MULTI-LEVEL INTERCONNECTION SCHEMES

Figure 8:
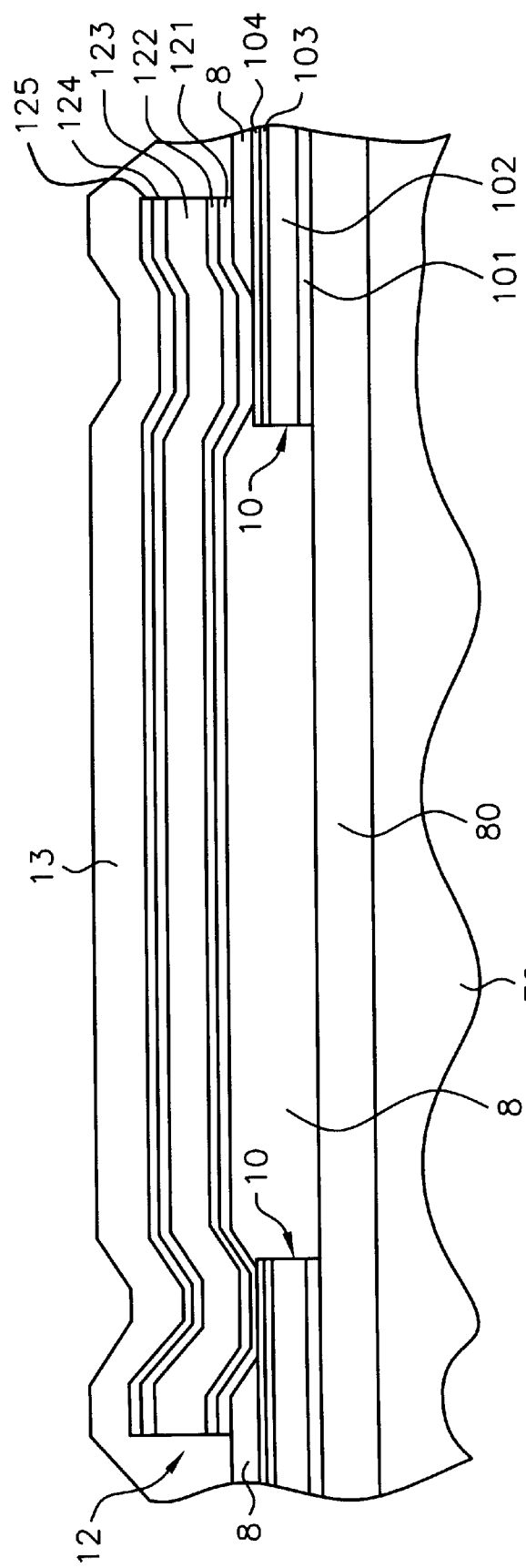
FIG. 8 is a planar view of a conducting interconnect with an interlevel contact fabricated using a subtractive etch.

Additional multi-level interconnection schemes according to the present invention may also be fabricated using a subtractive etch process. Shown in FIG. 8 is a first level M1 conducting interconnect 10 having a titanium adhesive layer 101, an aluminum-containing layer 102, a second titanium layer 103, and an anti-reflection layer 104. M1 conducting interconnect 10 is formed on a substrate 70, which contains solid state devices (not shown), and insulating passivation layer 80. An insulating passivation layer 8 is also disposed above M1 conducting interconnect 10.

A second level M2 conducting interconnect 12 is disposed on insulating passivation layer 8 and is connected to M1 conducting interconnect 10. M2 conducting interconnect 12 has an adhesion layer 121 preferably of titanium, a diffusion barrier layer 122 preferably of titanium nitride, an aluminum-containing layer 123, a redundant metal layer 124 preferably of titanium, and an anti-reflection layer 125 preferably of titanium nitride. The solid state devices (not shown) of substrate 70 are indirectly connected to M2 conducting interconnect 12 via M1 conducting interconnect 10 as well as by contacts and conductors (not shown) which may be formed in the insulating passivation layer 80. An additional insulating passivation layer 13 is disposed on M2 conducting interconnect 12.

The multi-level interconnection schemes shown in FIG. 8 may be made using the following process:
a. forming on an insulating passivation layer 80 disposed on a substrate 70, M1 conducting interconnects 10 using steps s through y as described in the process set forth above;
b. depositing an insulating passivation layer 8 on M1 conducting interconnects 10 and insulating passivation layer 80;
c. applying a resist layer and pattern using lithographic techniques to locate holes where contact is to be established with underlying M1 conducting interconnects 10;
d. etching the underlying insulating passivation layer 8 using the resist layer as a mask;
e. etching the underlying insulating passivation layer 8 using a sputtered etch for providing a tapered via in M2 conducting interconnect 12 which is formed above M1 conducting interconnect 10 in steps f–k below;
f. depositing a layer of a conductive material, preferably titanium, for forming adhesion layer 121 of conducting interconnect 12;
g. depositing a second layer of titanium nitride which forms diffusion barrier layer 122;
h. depositing an aluminum-containing layer 123 comprising 0.5 wt % Cu;
i. depositing a layer which forms a refractory redundant layer 124 of conducting interconnect 12, preferably of a refractory metal such as titanium,;
j. depositing a top layer of titanium nitride to serve as an anti-reflection layer 125;
k. applying a resist layer to the top of the multi-layer film formed in steps f–j and, using lithographic techniques known in the art, pattern to locate an M2 conducting interconnect 12 having aspect ratios in accordance with the present invention as set forth above;
l. transferring the pattern to the underlying conducting films by etching with a plasma containing $C$-$Cl_4$ to form M2 conducting interconnect 12;
m. depositing an overlying insulating passivation layer 13; and
n. repeating steps a through m to produce additional interconnect levels as desired.

PROCESS 2: Damascene Inter Level Contact with Damascene Conductor

Alternative processes for producing interconnection schemes according to the present invention may also be used and may include damascene processes for forming both the metallization interconnects and interlevel connection studs by:
a. Depositing an insulating layer and planarize using chemical mechanical polishing or an etch back technique;
b. applying a first resist, and pattern the resist as taught in this invention using lithographic techniques known in the art;
c. transferring the pattern in the resist to the underlying insulator by etching troughs with depth equal to the desired thickness of the conducting interconnect to be produced;
d. removing the first resist layer;
e. applying a second resist layer and pattern using lithographic techniques to open holes where contacts to the underlying substrate are to be formed;

f. depositing the first layer of adhesion and barrier metallurgy;

g. depositing the second layer of conducting interconnect such as aluminum containing 0.5 wt % Cu, gold, or copper;

h. planarizing using chemical mechanical polishing to remove the excess metal outside the trough;

i. depositing an overlying insulating passivation layer; and j. repeating steps b through j as often as necessary.

PROCESS 3: Lift-Off Process

Interconnections in accordance with the present invention may also be fabricated by other known techniques such as by depositing a conductor material, lifting off the portion of unwanted conductor material to produce interconnects having aspect ratios as described above, followed by insulator deposition and planarization as are known in the art.

ALTERNATIVE METALLIZATION INTERCONNECT PATTERNS

Having taught metallization interconnect aspect ratios effective in reducing electromigration failure by extrusion-shorts, it is to be understood that the patterns taught here may be further optimized to reduce overall resistance and improve circuit function. Generally, it is desirable to reduce resistance by making the dimensions of a conductor as large as possible consistent with wiring requirements and generally it is desirable to make capacitance between lines as small as possible by spacing the lines as far apart as possible. Additional considerations include reducing current density to reduce susceptibility of a conductor to electromigration and minimizing the number of inter-level contacts to improve yield of manufactured integrated circuits. When considering the reliability of the resulting interconnect it is necessary to choose sufficiently large dimensions to reduce the current density to a level where resistance increase of the interconnect during operation will not impair function.

Figure 9:
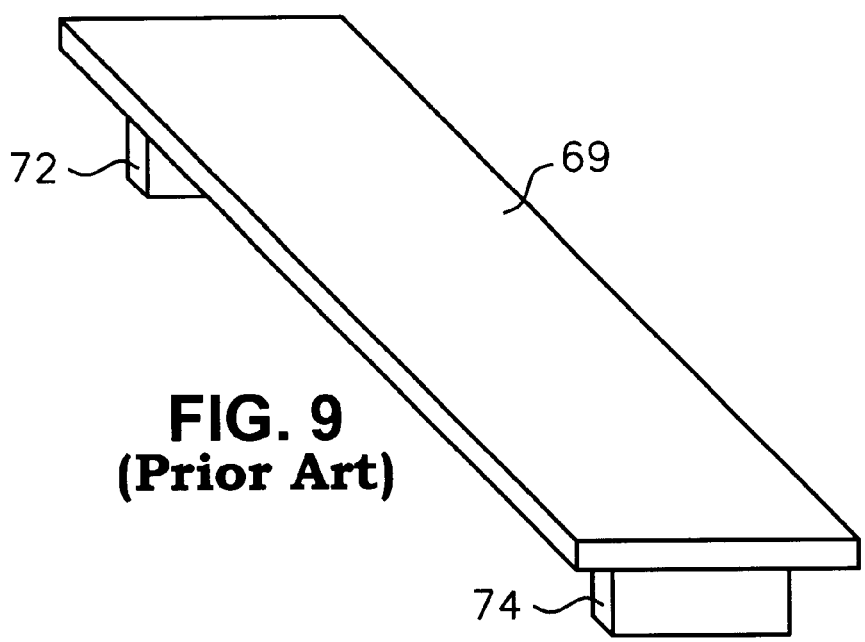
FIG. 9 is a planar view of a conventional wide conducting interconnect having inter level contacts.

Shown in FIG. 9 is a conventional wide-line interconnect 69 having interlevel connection studs 72 and 74 on either end. As discussed above, wide-line interconnect 69 is prone to extrusion-short failure caused by electromigration. According to the present invention, alternative interconnect patterns are envisioned and shown in FIGS. 10, 11, 12A, and 12B which replace the conventional wide-line interconnect 69 with a variety of conducting interconnects 70 having a plurality of connected interconnects each having aspect ratios less than or equal to unity with preferred aspect ratios being below about 0.67.

Figure 10:
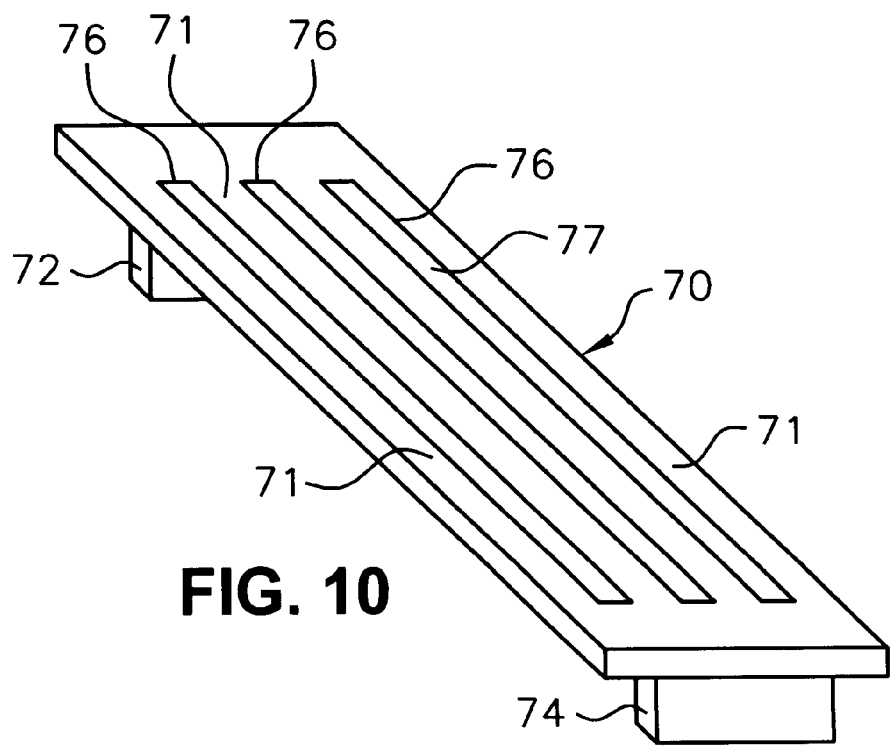
FIG. 10 is a planar view of a wide conducting interconnect having longitudinal slots filled with passivation insulation and interlevel contacts according to the present invention.

As shown in FIG. 10, a conducting interconnect 70 may be made up of a plurality of narrow individual interconnects 71 which are multiple, long, parallel lines connected at their ends with each having aspect ratios less than or equal to unity. A plurality of slots 76 are provided between the individual interconnects 71 and are filled with an insulating passivation material 77 such as $SiO_2$. Insulating passivation material 77 may also be made of a polymer such as polyimide or parylene.

Figure 11:
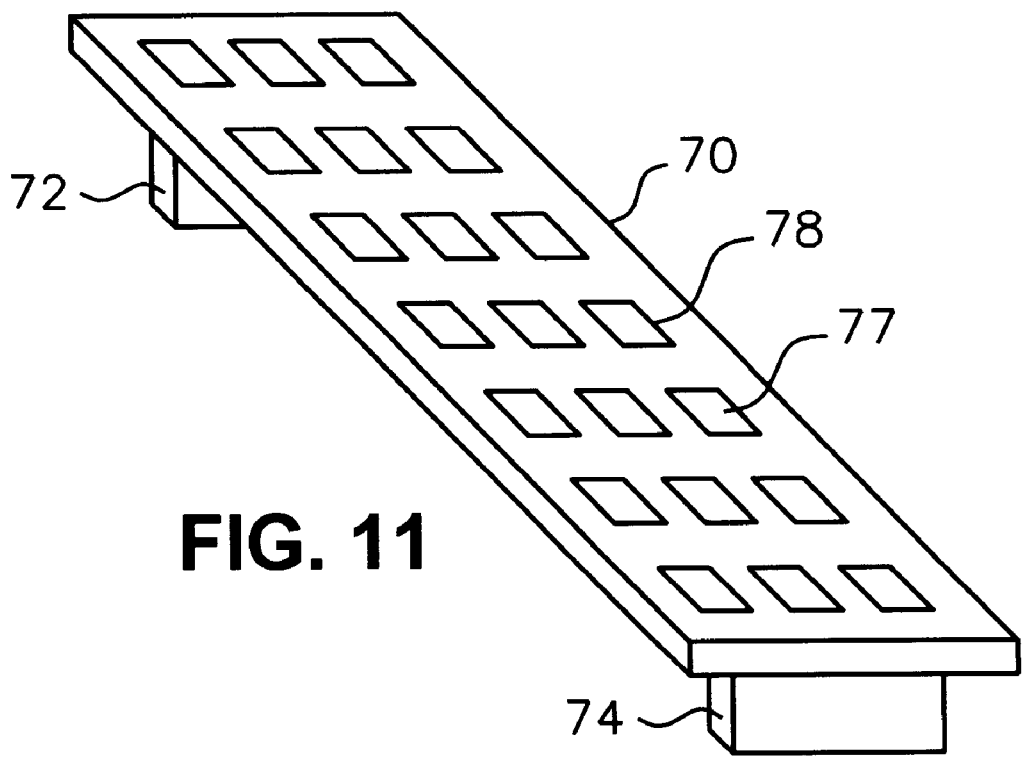
FIG. 11 is a planar view of a wide conducting interconnect having aligned transverse holes filled with passivation insulation and interlevel contacts according to the present invention.
Figure 12A:
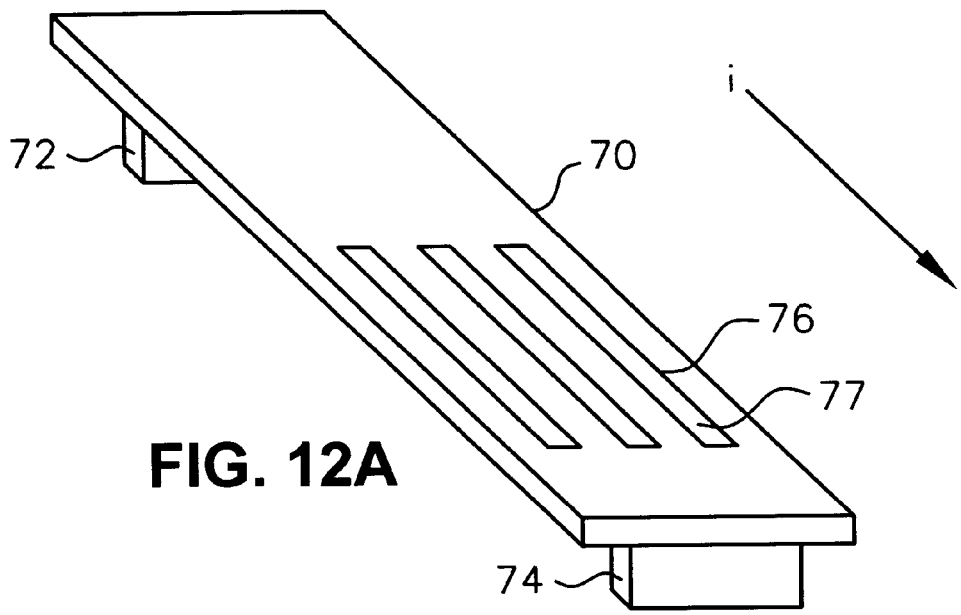
FIG. 12A is a planar view of a wide conducting interconnect according to the present invention similar to that shown in FIG. 10 but with the passivation-filled longitudinal slots disposed downstream of the electron current flow, adjacent to the electron sink.
Figure 12B:
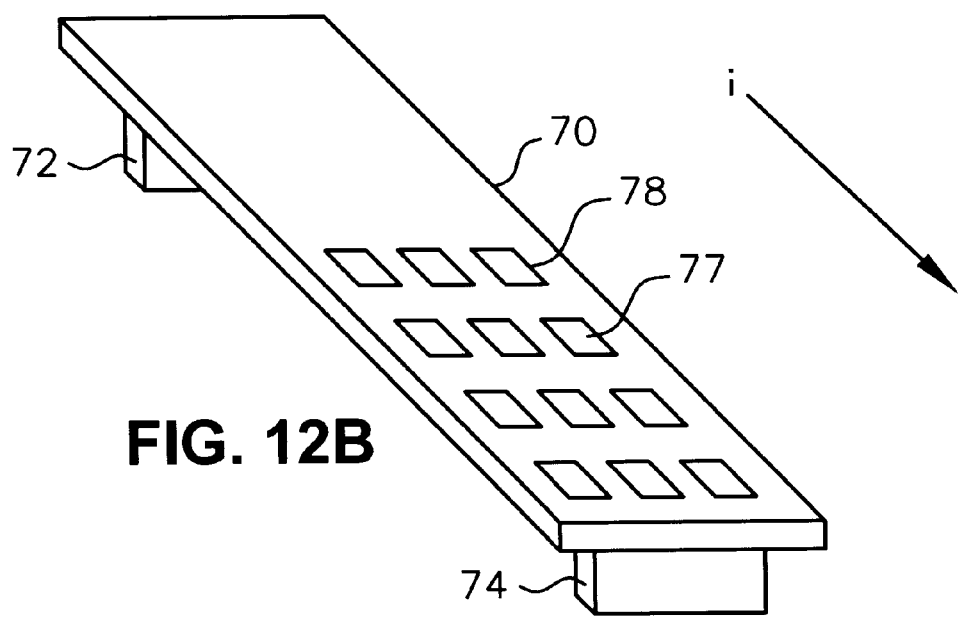
FIG. 12B is a planar view of a wide conducting interconnect according to the present invention similar to that shown in FIG. 11 but with the passivation-filled holes disposed downstream of the electron current flow, adjacent to the electron sink.

The multiple, long, parallel lines of individual interconnects 71 of FIG. 10 having the alternating plurality of slots 76 filled with insulating passivation material 77 may also be replaced by a plurality of holes 78 filled with posts of insulating passivation material 77 to form a grid pattern as shown in FIG. 11. The metal of conducting interconnect 70 which remains between the posts of insulating passivation material 77 are provided in widths which are less than the thickness of the line such that the aspect ratio is less than or equal to unity. As discussed above, because the stress build-up in conducting interconnect 70 tends to increase at the downstream end (with respect to electron current flow), the plurality of slots 76 and holes 78 filled with insulating passivation material 77 need only be utilized and located in the region of stress increase as shown in FIGS. 12A and 12B, respectively. The region of stress increase is located near the anode or electron current sink.

It is possible to simulate a diffusion blocking situation without actually using a blocking material such as tungsten (W). The idea is illustrated in FIG. 13, where a single interconnect consists of region 501 of width W1 and region 502 of width W2. W2>W1, the interconnect alternates between regions 501 and 502, and regions 501 and 502 are electrically connected. In FIG. 13A, there are no passivation-filled regions anywhere along the interconnect, while in FIG. 13B, there are passivation-filled regions in region 502. The idea here is that for a constant current flowing through the interconnect, a diffusion blocking situation will occur since the current density changes in going from region 501 to region 502. This will increase the electromigration lifetime of the interconnect. The actual widths and lengths of regions 501 and 502 are not critical.

A long interconnect (FIG. 14A) can be divided into regions of passivation-filled holes and regions without such holes (FIG. 14B) to improve electromigration. Here, the total length of the interconnect is L1 and the length between slotted regions is L2. The idea is to simulate a diffusion blocking material with the slotted regions since the current density is much higher here than in the non-slotted regions. If L2 is made short enough, then the extrusion lifetime will be increased and the resistance saturation level will be minimized.

Figure 15:
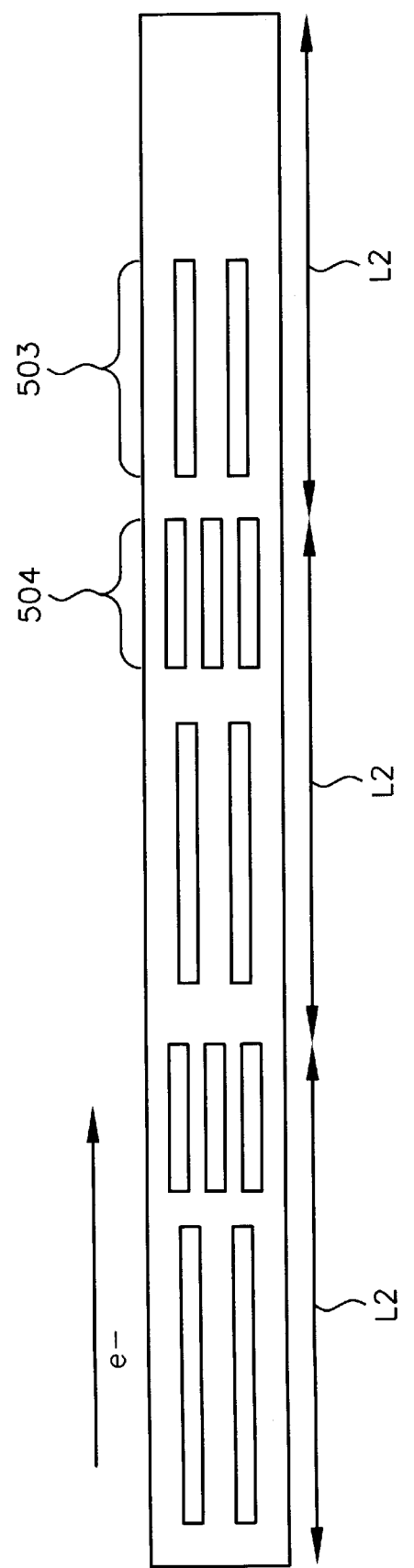
FIG. 15 is a planar view of a wide conducting interconnect according to the present invention which includes regions of passivation-filled holes, where the number of such regions varies across the interconnect.

Finally, a wide interconnect can be subdivided into regions of passivation-filled holes, where the number of such passivation-filled holes varies across the interconnect. As shown in FIG. 15, a wide-line interconnect consists of region 503 where the number of narrow interconnects is 3, and region 504 where the number of interconnects is 4. The wide-line interconnect alternates between regions 503 and 504, such that regions 503 and 504 are electrically connected.

It should be understood that the patterning techniques illustrated in FIGS. 13–15 need only be implemented such that the diffusion blocking situation is only located in the region of stress increase. The region of stress increase is located near the anode or electron current sink.

Referring back to FIGS. 12A and 12B, the plurality of slots 76 and holes 78 filled with insulating passivation material 77 in conducting interconnect 70 may also be fabricated with an electrical conductor disposed on the surfaces of the insulating material. Preferably tungsten, which also acts as a diffusion barrier, deposited on titanium nitride would be incorporated as the conductor as this construction would provide good adhesion to the top and bottom layers of a silicon dioxide insulating passivation material. Such a layered construction would further inhibit the propagation of cracks at the interface to adjacent insulating passivation material layers. Alternatively, the insulating passivation material may be replaced entirely by tungsten. In this case, the slots 76 and holes 78 could be filled with tungsten using methods similar to those disclosed in U.S. Pat. No. 5,470,788 issued to Biery et al., which patent is incorporated herein by reference.

The benefits of patterning conducting interconnects in integrated circuits according to the present invention is related to the geometry of the interconnects. It is envisioned and to be understood that the materials used in the interconnect schemes to illustrate the present invention are only exemplary and are not meant to exclude other options which will be readily apparent to those of ordinary skill in the art upon reading and as taught by the above disclosure. Accordingly, although the disclosure above is made with respect to interconnects having redundant metallization layers and interlevel connections made of particular materials, it will be readily apparent to those of ordinary skill in the art that the present invention is not limited to the particular materials disclosed. Rather, the attendant benefits may be derived when using other materials not explicitly discussed in the preferred embodiments above in order to prevent extrusion-short failure in other interconnects made of materials which are subject to electromigration when used with or without redundant layers or other materials. Such interconnect materials may include metals such as gold, copper, copper alloys, aluminum, and aluminum-copper alloys. Other redundant layer materials may include titanium, tantalum, tungsten, titanium-tungsten alloy, titanium aluminide, titanium nitride, and tantalum nitride. In addition, it will be readily recognized that the teachings of the present invention are not limited to interconnection schemes having the specific diffusion barriers enumerated above (i.e., tungsten interlevel connection studs or the particular redundant metallization layers) but may be applied to any interconnection scheme having diffusion barriers which cause extrusion shorts between electrically connected interconnections.

Thus, although illustrated and described with reference to certain specific embodiments, the present invention is nevertheless not intended to be limited to the details shown. Rather, various modification may be made in the details within the scope and range of equivalents of the claims and without departing from the spirit of the invention.

What is claimed:

1. An integrated circuit comprising:
   a semiconductor substrate and a wide-line interconnect on said substrate, said wide-line interconnect including a plurality of narrow interconnects to minimize electromigration, said plurality of narrow interconnects extending, and separated from each other for a portion of a length that lies between a cathode or electron current source and an anode or electron current sink, said plurality of narrow interconnects lies closer to said anode or electron current sink of said wide-line interconnect, each narrow interconnect having a width, W, and a height, H, such that each narrow interconnect has an aspect ratio defined as W/H which is less than or equal to unity, and said plurality of narrow interconnects being multiple layers of thin film metallization layers.

2. The integrated circuit of claim 1, wherein said aspect ratio is below about 0.67.

3. The integrated circuit of claim 1, wherein said plurality of narrow interconnects are connected by interlevel connection studs.

4. The integrated circuit as recited in claim 3, wherein said interlevel connection studs are made of tungsten.

5. The integrated circuit as recited in claim 1, wherein said plurality of narrow interconnects are separated from each other by an insulating passivation layer.

6. The integrated circuit of claim 5, wherein said insulating passivation layer comprises a material selected from the group consisting of silicon dioxide, polyimide, parylene, Dow Cyclotene, Dow SiLK, diamond like carbon, silicon nitride, polytetraflouro-ethylene, and a nano-pore containing material.

7. The integrated circuit as recited in claim 1, wherein one or more of said plurality of narrow interconnects each comprise a multi-layered metallization structure comprising a conductive metallization layer and at least one redundant metallization layer disposed on said conductive metallization layer.

8. The integrated circuit of claim 7, wherein said conductive metallization layer comprises a material selected from the group consisting of gold, copper, copper alloys, aluminum, and an aluminum-copper alloy, and said at least one redundant metallization layer comprises a material selected from the group consisting of titanium, tantalum, tungsten, titanium-tungsten alloy, titanium aluminide, titanium nitride, and tantalum nitride.

9. The integrated circuit as recited in claim 8, wherein said aluminum-copper alloy comprises 0.5 wt % copper.

10. An integrated circuit as recited in claim 1, wherein said plurality of narrow interconnects are parallel lines disposed between a cathode or electron current source and an anode or electron current sink such that the parallel lines are disposed closer to an anode or electron current sink.

11. The integrated circuit as recited in claim 1, wherein said plurality of narrow interconnects are parallel lines disposed between said cathode or electron current source and said anode or electron current sink, such that the parallel lines are disposed closer to said anode or electron current sink, with said parallel lines being joined together at multiple locations along their length between said cathode or electron current source and said anode or electron current sink, said parallel lines joined closer to said anode or electron current sink and being separated from each other along the length of said wide-line interconnect and along a width of said wide-line interconnect.

12. The integrated circuit as recited in claim 1, wherein said interconnects are constrained from diffusing by diffusion blocking material on all surfaces thereof.

13. An electrically conductive stripe comprising:
    a plurality of narrow electrically conductive stripes separated from each other and extending for a portion of a length that lies between a cathode or electron current source and an anode or electron current sink, said plurality of narrow electrically conductive stripes lies closer to said anode or electron current sink of said electrically conductive stripe, each narrow electrically conductive stripe having a width, W, and a height, H, wherein said narrow electrically conductive stripe has an aspect ratio defined as W/H which is less than 0.5, and said plurality of narrow electrically conductive stripes being multiple layers of thin film metallization layers.

14. The electrically conductive stripe as recited in claim 13, wherein each narrow electrically conductive stripe has a multi-layered metallization structure comprising a conductive metallization layer and at least one redundant metallization layer disposed on said conductive metallization layer.

15. The electrically conductive stripe as recited in claim 14, wherein said conductive metallization layer comprises a material selected form the group consisting of gold, copper, copper alloys, aluminum, and an aluminum-copper alloy, and said at least one redundant metallization layer comprises a material selected from the group consisting of titanium, tantalum, tungsten, titanium-tungsten alloy, titanium aluninide, titanium nitride, and tantalum nitride.

16. The electrically conductive stripe as recited in claim 15, wherein said aluminum-copper alloy comprises 0.5 wt % copper.

17. An integrated circuit comprising:
a semiconductor substrate and a plurality of narrow interconnects formed thereon designed to minmize electromigration, said plurality of narrow interconnects lie between a cathode or electron current source and an anode or electron current sink, said plurality of narrow interconnects lies closer to said anode or electron current sink, said plurality of interconnects being electrically connected and having a width, W, and a height, H, such that the interconnects have an aspect ratio defined as W/H which is less than or equal to unity, said plurality of interconnects include a plurality of insulating passivation layers disposed alternately between said plurality of said interconnects, said plurality of insulating passivation layers being of a high modulus material, and insulating passivation layers above said plurality of insulating passivation layers being of a low dielectric constant interlevel dielectric.

18. The integrated circuit of claim 17, wherein said high modulus material is selected from the group consisting of silicon dioxide, silicon nitride, and diamond like carbon.

19. The integrated circuit of claim 17, wherein said low dielectric constant interlevel dielectric is polyimide.

20. An integrated circuit comprising:
a semiconductor substrate and an interconnect formed thereon, said interconnect having along a length thereof a first region of width W1 and a second region of width W2, wherein W1>W2 and said first and second regions are electrically connected, said interconnect along said length lies between a cathode or electron current source and an anode or electron current sink, with said interconnect along said length being closer to said anode or electron current sink;

said interconnect has a plurality of said first regions and a plurality of said second regions that lie between said cathode or electron current source and said anode or electron current sink, said plurality of said first regions and said plurality of said second regions lie closer to said anode or electron current sink, and said first and second regions alternate along the length of said interconnect;

said first regions of said interconnect each includes a plurality of narrow interconnects to minimize electromigration, said plurality of narrow interconnects lie between said cathode or electron current source and said anode or electron current sink, said plurality of narrow interconnects lies closer to said anode or electron current sink, said plurality of narrow interconnects separated form each other along a length of each said first region, and said plurality of narrow interconnects being electrically connected to said interconnect;

said interconnect has a width W, and a height H, and each narrow interconnect in each of said first regions has an aspect ratio of W/H which is less than or equal to unity.

21. The integrated circuit of claim 20, wherein said plurality of narrow interconnects are of multiple layers of thin film metallization, and said plurality of narrow interconnects having sides with diffusion blocking material to constrain diffusion.

* * * * *